US008426968B2

(12) United States Patent
Hollis

(10) Patent No.: US 8,426,968 B2
(45) Date of Patent: Apr. 23, 2013

(54) HIGH SPEED, HIGH DENSITY, LOW POWER DIE INTERCONNECT SYSTEM

(75) Inventor: Ernest E. Hollis, Bedford, MA (US)

(73) Assignee: Sagacious Investment Group L.L.C., Dover, DE (US)

( * ) Notice: Subject to any disclaimer, the term of this patent is extended or adjusted under 35 U.S.C. 154(b) by 126 days.

(21) Appl. No.: 13/169,384

(22) Filed: Jun. 27, 2011

(65) Prior Publication Data

US 2011/0254162 A1    Oct. 20, 2011

Related U.S. Application Data

(62) Division of application No. 11/459,081, filed on Jul. 21, 2006, now Pat. No. 7,999,383.

(51) Int. Cl.
*H01L 23/52* (2006.01)

(52) U.S. Cl.
USPC .... 257/758; 257/777; 257/778; 257/E23.019; 257/E23.142; 257/E25.015

(58) Field of Classification Search .................. 257/698, 257/758, 777, 778, E23.011, E23.019, E23.142, 257/E25.011, E25.012, E25.015, E25.016, 257/E25.026
See application file for complete search history.

(56) References Cited

U.S. PATENT DOCUMENTS

| | | | |
|---|---|---|---|
| 5,051,865 A | 9/1991 | Kato | |
| 5,225,634 A | 7/1993 | Petroz | |
| 5,269,882 A | 12/1993 | Jacobsen | |
| 5,420,460 A | 5/1995 | Massingill | |
| 5,533,664 A | 7/1996 | Sasaki et al. | |
| 5,568,356 A | 10/1996 | Schwartz | |
| 5,592,025 A | 1/1997 | Clark et al. | |
| 5,594,275 A | 1/1997 | Kwon et al. | |
| 5,641,297 A | 6/1997 | Kozel | |
| 5,646,828 A | 7/1997 | Degani et al. | |
| 5,663,530 A | 9/1997 | Schueller et al. | |
| 5,673,131 A | 9/1997 | Jacobsen | |
| 5,686,699 A | 11/1997 | Chu et al. | |
| 5,703,402 A | 12/1997 | Chu et al. | |
| 5,734,199 A | 3/1998 | Kawakita et al. | |
| 5,736,789 A | 4/1998 | Moscicki | |
| 5,790,384 A | 8/1998 | Ahmad et al. | |
| 5,834,843 A | 11/1998 | Mori et al. | |

(Continued)

OTHER PUBLICATIONS

International Search Report and Written Opinion for International Patent Application No. PCT/US07/15797 mailed Feb. 8, 2008.

(Continued)

*Primary Examiner* — Matthew E Warren
(74) *Attorney, Agent, or Firm* — McAndrews, Held & Malloy, Ltd.

(57) ABSTRACT

A system for interconnecting at least two die each die having a plurality of conducting layers and dielectric layers disposed upon a substrate which may include active and passive elements. In one embodiment there is at least one interconnect coupling at least one conducting layer on a side of one die to at least one conducting layer on a side of the other die. Another interconnect embodiment is a slug having conducting and dielectric layers disposed between two or more die to interconnect between the die. Other interconnect techniques include direct coupling such as rod, ball, dual balls, bar, cylinder, bump, slug, and carbon nanotube, as well as indirect coupling such as inductive coupling, capacitive coupling, and wireless communications. The die may have features to facilitate placement of the interconnects such as dogleg cuts, grooves, notches, enlarged contact pads, tapered side edges and stepped vias.

20 Claims, 25 Drawing Sheets

U.S. PATENT DOCUMENTS

| | | | |
|---|---|---|---|
| 5,869,894 | A | 2/1999 | Degani et al. |
| 5,969,426 | A | 10/1999 | Baba et al. |
| 6,005,292 | A | 12/1999 | Roldan et al. |
| 6,008,530 | A | 12/1999 | Kano |
| 6,064,113 | A | 5/2000 | Kirkman |
| 6,107,685 | A | 8/2000 | Nishiyama |
| 6,150,729 | A | 11/2000 | Ghahghahi |
| 6,310,403 | B1 | 10/2001 | Zhang et al. |
| 6,344,683 | B1 | 2/2002 | Kim |
| 6,348,740 | B1 | 2/2002 | Chiu et al. |
| 6,357,595 | B2 | 3/2002 | Sembonmatsu et al. |
| 6,686,654 | B2 | 2/2004 | Farrar et al. |
| 6,710,435 | B2 | 3/2004 | Nagaya et al. |
| 6,790,704 | B2 | 9/2004 | Doyle et al. |
| 6,841,417 | B2 | 1/2005 | Jojiki |
| 2009/0042365 | A1 | 2/2009 | McDonald |

OTHER PUBLICATIONS

Gann, Keith D., Neo-Stacking Technology, Dec. 1999, HDI Magazine-Miller Freeman, Inc., pp. 1-4.

Mello, Jim, "Executive Roundup: On the Path to a New Semi Industry", Semiconductor International, Jun. 2009, 3 pgs.

Hollis, E.E., "Power Spectrum of Distorted Expanded Pulse Trains", Proceedings of the IEEE; Oct. 1963, pp. 1372-1373.

Hollis, E.E., "Comparison of Combined Barker Codes for Coded Radar Use", IEEE Transactions on Aerospace and Electronic Systems, Jan. 1967, pp. 141-143.

Hollis, E.E., "Outputs of a Moving Window Crosscorrelator When the Input is a Phase Reversed Code", IEEE Transactions on Aerospace and Electronic Systems, Jan. 1967, pp. 143-144.

Pettit, R.H., "Pulse Sequences with Good Autocorrelation Functions", Microwave Journal, Feb. 1967, pp. 63-67, Correction by E.E. Hollis and R.E. Orr, Jul. 1968.

Hollis, E.E., "Predicting the Truncated Autocorrelation Functions of Combined Barker Sequences of Any Length Without Use of a Computer", IEEE Transactions on Aerospace and Electronic Systems, Mar. 1967, pp. 368-369.

Dance, Brian, "Carbon Nanotubes Grown at Predefined Sites on Silicon Wafers", [online][retrieved on Nov. 20, 2006] Retrieved from the internet<URL:http//www.reed-electronics.com/semiconductor/index.asp?layout=articlePrint&articleID=CA239575>, pp. 1.

"Multichip Packages Spur High-Capacity Memories in Portable Devices", [online][retrieved on Nov. 20, 2006] Retrieved from the internet <URL: http://www.electronicproducts.com/ShowPage.asp?FileName=olijh01.aug.2005.html>, pp. 1-2.

"Letter to the Editor", The Microwave Journal, pp. 67-77.

Pao et al., "BGAs in Automotive Applications", SMT, Jan. 1998, pp. 50-54.

"Optical Technology Uses Electronics and Photonics for Higher Data Rates", High Frequency Electronics, Sep. 2005, p. 28, Summit Technical Media.

Paultre, Alix, "Light-Trapping Technology May Advance Optoelectronic Communications", [online][retrieved on Dec. 15, 2006] Retrieved from the internet <URL://http://www.electronicproducts.com/print.asp?ArticleURL-olap01.nov2005.html>, pp. 1-2.

Baliga, John, "Flip-Chip Packaging: Prepare for the Ramp-Up", [online][retrieved on Dec. 15, 2006] Retrieved from the internet <URL:http://www.reed-electronics.com/semiconductor/index.asp?layout=articlePrint&articleID=CA164143>, pp. 1-6.

Livengood et al., "FIB Techniques to Debug Flip-Chip Integrated Circuits", [online][retrieved Dec. 15, 2006]Retrieved from the internet <URL:http://www.reed-electronics.com/semiconductor/index.asp?layout=articlePrint&articleID=CA164147>, pp. 1-4.

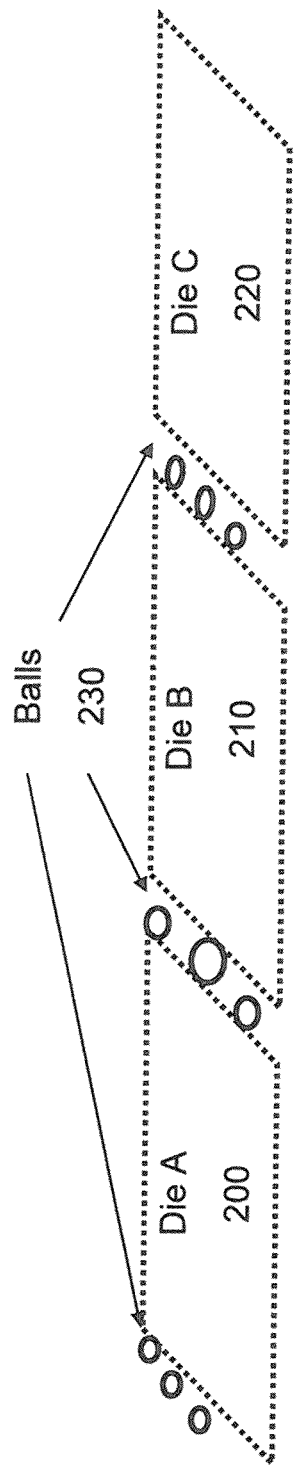
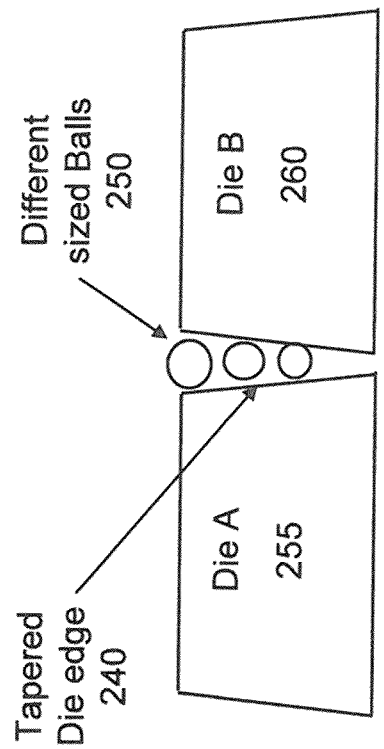
Figure 2a
Figure 2b

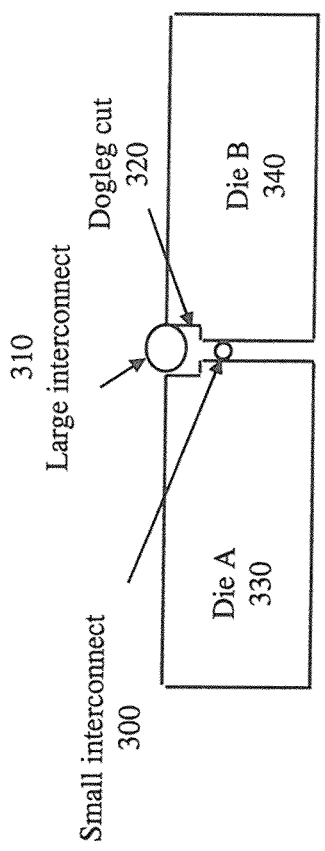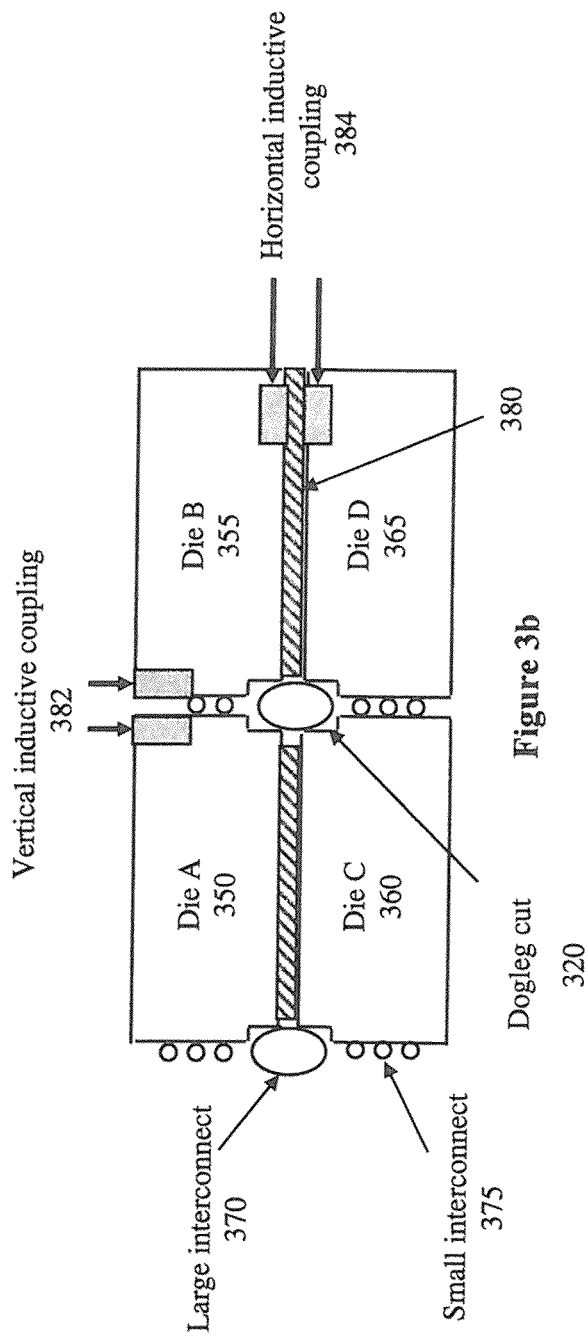

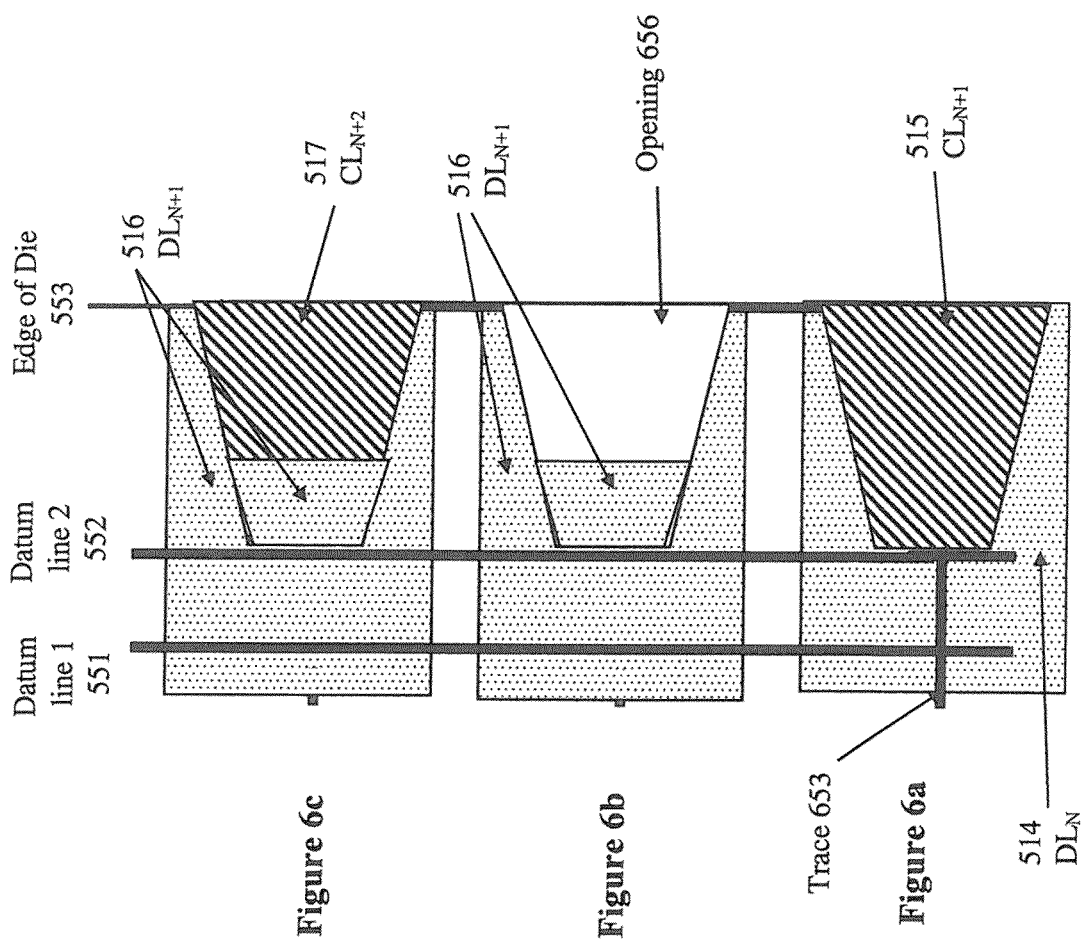

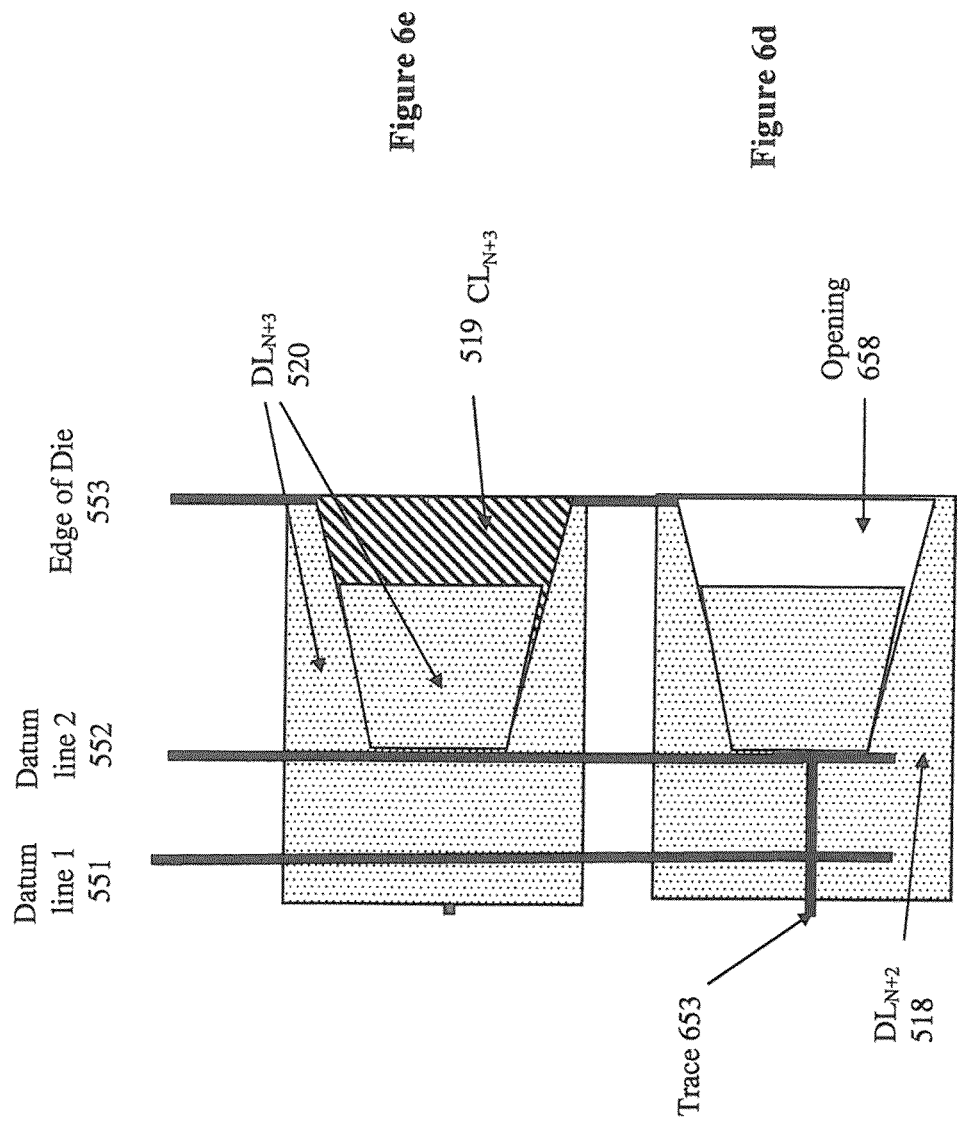

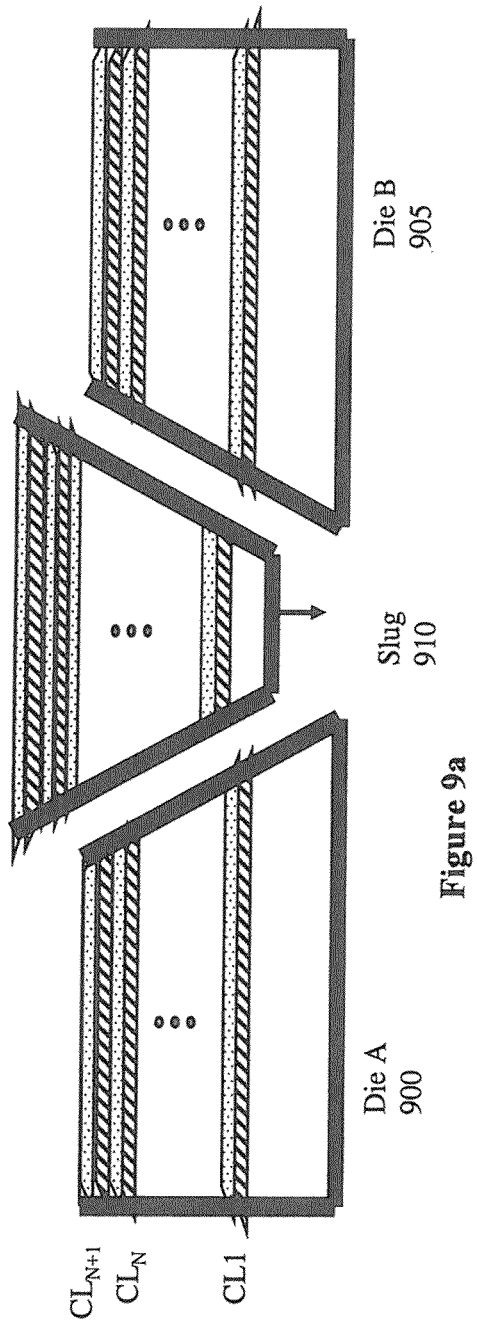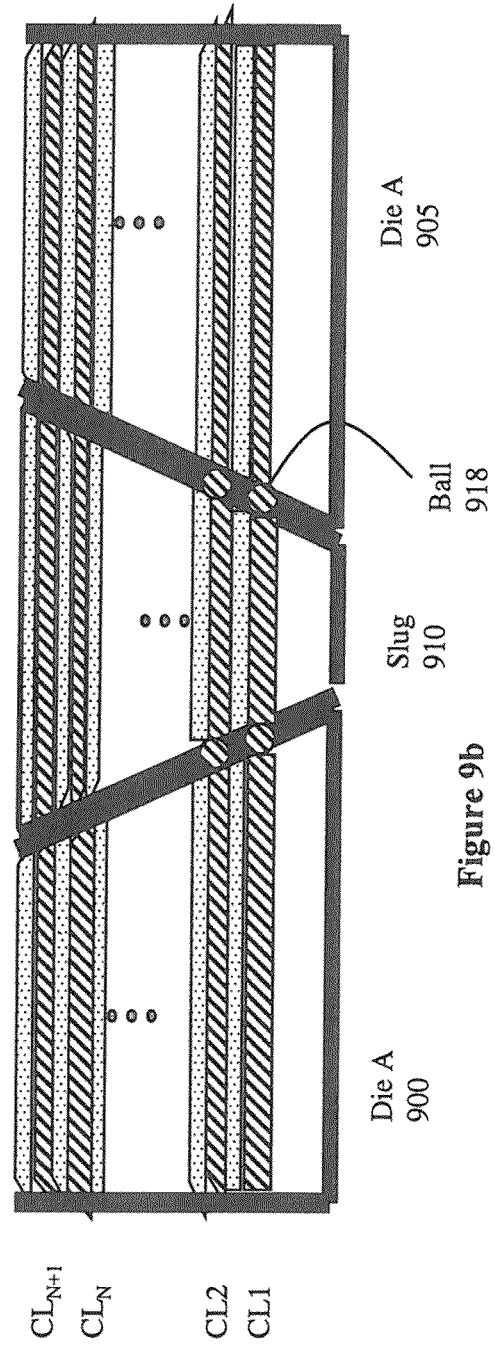

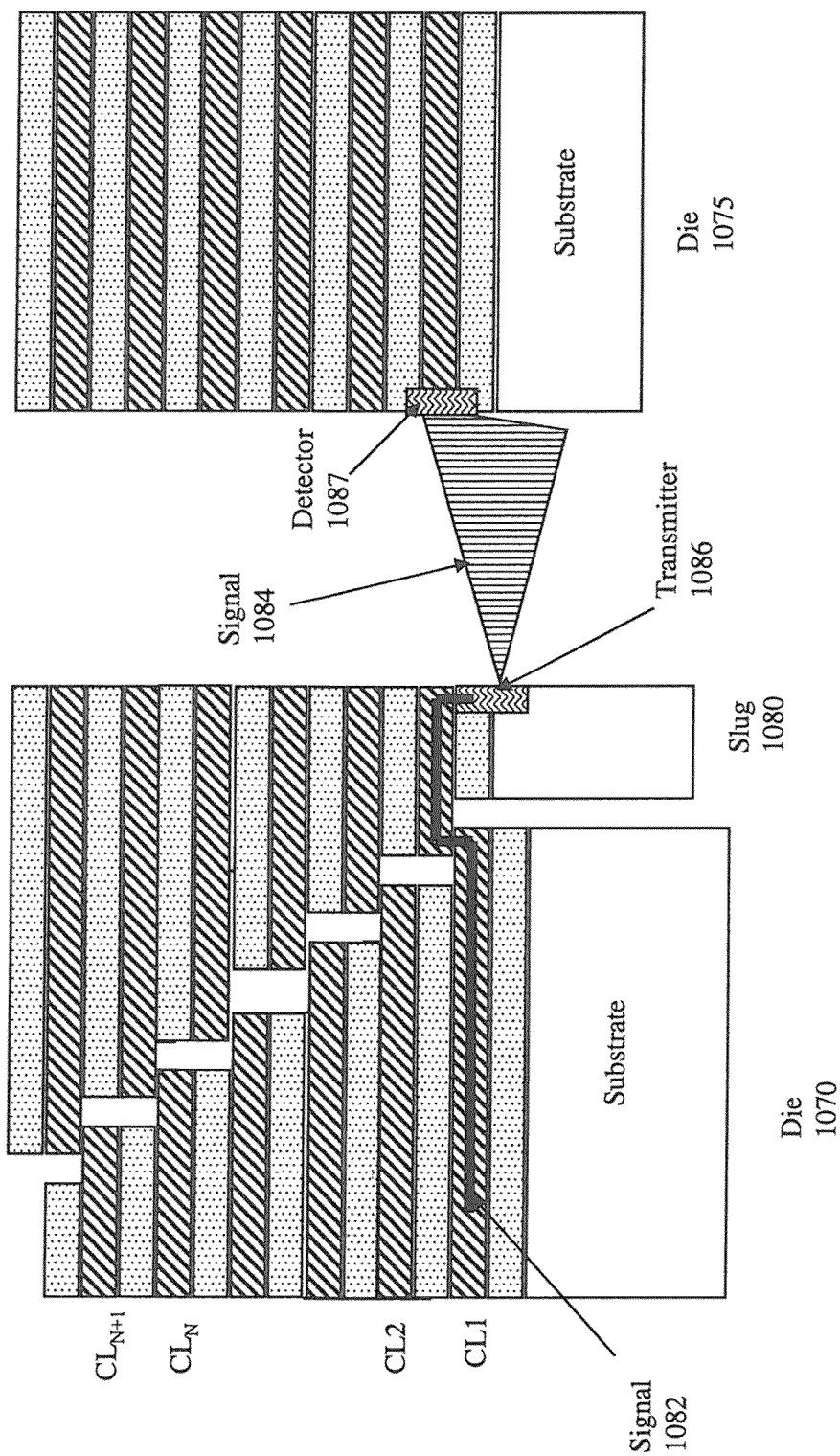

HIGH SPEED, HIGH DENSITY, LOW POWER DIE INTERCONNECT SYSTEM

CROSS REFERENCE TO RELATED APPLICATIONS

This application is a divisional application of U.S. patent application Ser. No. 11/459,081 filed Jul. 21, 2006.

FIELD OF THE INVENTION

The present invention relates generally to integrated circuit packaging and more particularly to interconnecting die.

BACKGROUND OF THE INVENTION

Integrated Circuit (IC) packages, chips (sometimes called die), and other devices have evolved into very dense packaged structures. Semiconductor miniaturization has resulted in the development of very large scale integrated circuit (VLSI) devices with millions of active and passive components. These devices are typically encapsulated in a protective package providing a large number of pin-outs for mounting or interconnection to external circuitry through a carrier substrate such as a printed circuit board or other higher-level packaging.

The semiconductor industry is well over 60 billion dollars a year market. Improved fabrication technologies have lowered cost while increasing functional power thereby revolutionizing the electronic Marketplace. The ability to put more and more functionality and higher performance is generally made possible by repeatedly shrinking feature sizes. However, as the more and more functionality and performance characteristics are included in these chips, the limits of current technologies and methodologies are approached. There are a number of issues and trends that are becoming readily apparent. For example, package temperature issues are exacerbated by a number of factors including static power and lowered junction temperatures due to smaller feature sizes and lowered thresholds. Also, hot spots within the chips are exacerbated by the active elements being buried so deeply beneath the conducting layers and contacts.

In the formation of integrated circuits, a number of active and passive semiconductor devices are formed on each of many die on a wafer, such as silicon. The fabrication technology for integrated circuits has vastly improved yields such that large arrays of electronic circuits on many die are produced on a single semiconductor wafer. In a typical die, two or more silicide layers and up to eight metallization layers, each separated by a dielectric layer, are currently used to interconnect among the active and passive elements to form the individual circuits and to interconnect among those circuits to form the die. They are also used to provide bonding pads at the top of the die. For example, Texas Instruments has a 65 nm process that uses eleven (11) copper conducting layers plus two polysilicide layers for a total of twenty-seven (27) conducting and dielectric layers.

Typical interface schemes for integrated circuit packaging include Pin Grid Array (PGA), Ball Grid Array (BGA), and Land Grid Array (LGA). PGA packages use a two-dimensional array of pins directly connected by soldering or inserted into through-hole pads in a Printed Circuit Board (PCB). BGA packages have a two-dimensional array of conductive pads, such as balls, bumps or pillars, and are mounted by soldering the pads on the package to corresponding surface pads on the mount side of the PCB. LGA packages have an array of metal stubs and are mounted to the PCB in a clamp with a compressible interposer material placed between the package and the PCB.

For illustrative purposes, the description herein will focus somewhat on the most common package, the BGA. The BGA bond pads of the semiconductor die are sometimes connected to the printed circuit board via conductors, either by direct contact in a flip-chip orientation through conductive balls, bumps or pillars or, by intermediate connector elements comprising wire bonds, or TAB (flexible circuit) connections. More commonly they are connected inside a package which in turn is soldered to the PCB. In addition, as ball sizes shrink, they are less tolerant of the already worsening planarity problems.

One of the well-known problems with having the connection balls on the active surface of the die is the planarity required of the die. The problem is compounded as the number of mask levels increase to accommodate the latest demand for processors and memory. The further layers exacerbate the planarity problem and make the die connection more difficult. Another problem associated with the dense packaging is that the fanin/fanout of a given ball is limited to either a single fanin or a single fanout. One of many deleterious effects of this property is that only one element can be placed on a bus unless another delay stage is introduced. Typically, many three state elements are "hung" on a bus, and only one such element is active at any one time. The third state, the high impedance state, of the inactive elements ensures that they neither charge nor discharge the bus.

With respect to the formation of BGA structures, these structures typically require the die to be flipped upside down hence the name "flip chip". A problem with flipping the chip upside down is that all possibilities of monitoring chip behavior in-situ are eliminated. Integrated circuit (IC) dies typically connect to the substrate within the IC package using either wire bond or Flip-Chip technology. Flip-Chip bonding is normally used for high pin count IC dies, and the pins on the Flip-Chip die are called bump pads. As with the package array technologies, there is a matching pattern of pads on the package substrate. Interconnect on the package substrate is typically used to connect the pads on the substrate (connected directly to the IC die) to the pins, pads, or stubs on the surface of the package that gets inserted, soldered, or pressed to the PCB.

A further problem with using the current flip chip techniques arises from a combination of bringing the interconnects to the top of the die in combination with the large number of layers. The connection to/from the underlying layers must be brought to the top of the die for connection to a connection ball. Current chips have six to eight metallization layers plus two polysilicon layers, and each of these conducting layers is separated from adjacent conducting layers by a dielectric layer. Thus, a signal on the lowest conducting layer may have to go through as many as nine conducting layers and ten dielectric layers, including one on the top surface, in order to reach the top surface and be connected to an interconnect ball.

In order to traverse from each conduction layer through the intervening dielectric layer to connect to an adjacent conduction layer generally requires a stepped via to minimize and avoid step coverage problems. A stepped via is a hole whose cross-section is larger on one end than on the other. It has a contact on both conducting layers, and a short piece of interconnect to route to a via to go to the next upper or lower conduction layer. This process is repeated for each such signal line for each conducting layer until the top is reached. Both the vias and the contacts are considerably larger than the width of the line; thus a considerable area is utilized just for the interconnects to the balls on the top surface of the chip.

It is well-known that as the capacity and speed of many integrated circuit devices, such as dynamic random access memories (DRAMs) have increased, the number of inputs and outputs (I/Os) to/from each die has increased, requiring more numerous and complex external connections thereto and, in some instances, requiring undesirably long traces to place the bond pads serving as I/Os for the typical die in communication with the traces of the carrier substrate.

A related problem with the current techniques is the interconnectivity between dies. Signals that travel to other dies must traverse not just upwards in one die, but may also travel further upwards if the second die is on top of the first die. The signals may also traverse downward into a second die to reach the desired point on a given conduction layer in the second die. Thus, for example, the signal may traverse upwards through many conduction and dielectric layers to reach the top die surface and go through a ball, a bonding pad, or other connection structure on the first die. After a connection to a second die, the signal would then be similarly routed downwards from the top surface of the second die to the desired layer in the second die. Thus, for example, a given signal could traverse about thirty-eight (fifty-four in the case of the 65 nm process of Texas Instruments) conduction and dielectric layers and their associated vias plus two conduction balls, bonding pads, or other connection structure. And, each of the contact layers adds resistance that, in combination with the total length traversed by the signals, may impact signal quality, speed, noise margin, bus skew, slack and setup/hold times, rise and fall times, potential spike generation and signal cancellation and makes timing convergence and other design and verification aspects difficult and sometimes limits upper clock frequencies.

Thus, such a tortured path impacts both speed and signal integrity. It is well known that interconnect delays are often much greater than gate delays below feature sizes of roughly 0.5 to 0.35 micron. Traversing substantial numbers of interconnect layers on two or more die considerably exacerbates the problems of timing convergence, layout, and architecture. Attempts to minimize these problems typically place restrictions on the layers regarding the manner in which signals can travel among these layers. These restrictions increase the already difficult layout and hinder designer creativity. They also sometimes force restrictions on the architecture of the chip.

Long path lengths also add significantly to the capacitance seen by the source and slow the signal down. Moreover, as line widths continually decrease, 22 nanometers currently in development, the number of "squares" and hence the resistance of the line in a given length of line increases by about the same factor as the decrease in line widths. This then increases the resistance seen by the driving source, again by about the same factor as the decrease of the line widths, all else being the same.

Furthermore, the increased line resistance adds to often already strained power usage and dissipation while making it more difficult to make bus signal elements and slave clock signals track their respective functions.

In addition, as higher speed IC assemblies operate at lower operational signal voltages, noise problems also become problematic. Mutual inductance results from an interaction between magnetic fields created by signal currents flowing to and from a packaged IC die through leads or traces, while self inductance results from the interaction of the foregoing fields with magnetic fields created by oppositely-directed currents flowing to and from ground. Signal propagation delays, switching noise, and crosstalk between signal conductors resulting from mutual and self inductance of the conductive paths contribute to signal degradation.

While lead inductance in IC packages has not traditionally been troublesome, the increasing signal frequencies of state-of-the-art electronic systems have substantially increased the practical significance of package lead or trace inductance. For example, at such faster signal frequencies, performance of IC die using extended leads or traces for external electrical connection is slower than desirable because the inductance associated with the elongated conductive paths required slows changes in signal currents through the leads or traces, prolonging signal propagation. In addition, digital signals propagating along the leads or traces are spreading out causing the signal components and signals themselves to disperse. While mild dispersion merely widens the digital signals without detrimental effect, severe dispersion can make the digital signals unrecognizable. In addition, reflection signals propagating along the leads or traces as a result of impedance mismatches between the lead fingers and associated IC die or between the leads or traces and external circuitry, may distort normal signals propagating concurrently with the reflection signals. And, magnetic fields created by signal currents propagating through the lead or trace-associated inductance can induce currents in adjacent leads or traces, causing crosstalk noise.

Therefore, the state of the art die and package configurations described herein are having difficulties in keeping up with the trend towards faster devices at lower power. Noise problems are exacerbated by use of a large number of laterally adjacent traces of substantial and varying lengths extending from centralized die location to the horizontally-spaced, offset locations of vias extending to solder balls or other conductive elements for securing and electrically connecting the package to a carrier substrate.

There are various constraints that limit the number of signal traces that can be fabricated on a package. Industry standards impose specific requirements as to the spacing between solder balls, thereby restricting the spacing between the vias that electrically connect the signal traces to the solder bumps. The spacing restriction limits the number of signal traces that can fit between the vias which, in turn, limits the number of signal traces that can be used to carry signals to and from the die. Current fabrication technology imposes minimum pitch requirements for signal traces to attain satisfactory yields and to ensure mechanical and electrical reliability. The limitation on the maximum number of usable signal traces limits the maximum number of solder bumps, thereby placing a ceiling on the number of signals that a particular package can provide.

There are several levels of interconnections that make up an encapsulated integrated circuit. First, there are the internal interconnections of the circuit making up an individual die. Then there is the interconnection between the various dies themselves, especially if more than one die is in a package. There is also a connection layer between the dies and the package that allows external access.

With respect to the package connection, wire bonds are typically used to electrically connect the input/output (I/O) pads of the die to traces or pads on the package. If the die is on the side of the circuit board inside the package opposite the solder bumps, conductive vias are formed through the circuit to conduct signals from the solder bumps to the pads or traces. To enable routing in highly dense integrated circuit packages, there are many techniques known to those skilled in the art such as micro-vias, blind vias, buried vias, staggered vias.

A further problem with higher density and more complex circuit design relates to the verification at all the various steps along the process. As the number of layers and the die size increase, the resources to validate the different steps including the design rules of the layouts of the different layers increase exponentially.

In addition, the static power is greater due to leakage through the thin oxides required for the higher density circuits. There is also an increase in the number of conduction and concomitant dielectric layers which must be traversed to reach various parts of a given die and to interact with other dies. This increase gives rise to increased problems with layer to layer registration, step coverage with its potential failure modes, contact integrity, and validation problems. Because of aspect ratios, stepped vias must generally be used in most cases at the smaller feature sizes. However, using the stepped vias adds an additional mask layer for each such stepped via. Planarity also becomes more difficult with the denser circuits.

As noted herein, the existing packaging fail to address several criteria required for high density, high speed and low power packaging, namely: interconnections with non-planar die resulting from many layers on the die; limitations on the fanin/fanout; inability to monitor flip-chip packaging signals; and, very long signal travel paths resulting in signal reflection, degraded signal integrity, propagation delays, switching noise, crosstalk and dispersion. Therefore, what is needed is a mechanically and electrically desirable packaging scheme to accommodate high density high speed, low power packaging. Such a system should interconnect die without having to travel excessive paths and allow in-situ monitoring of critical signals. Ideally the system should be easily implemented without affecting the current and expected fabrication methods and machinery.

SUMMARY OF THE INVENTION

Accordingly it is a general object of the present invention to provide a novel and useful system and associated methods that can solve the prior problems described herein. The foregoing needs are satisfied by the inventions detailed herein that alleviate the aforementioned difficulties.

One embodiment of the invention is a system for interconnecting at least two die, comprising a first die having a plurality of first die conducting layers and first die dielectric layers, wherein the first die conducting layers and the first die dielectric layers are disposed upon a first substrate. There is a second die having a plurality of second die conducting layers and second die dielectric layers, wherein the second die conducting layers and the second die dielectric layers are disposed upon a second substrate. There is at least one interconnect structure coupling at least one contact of the first die conducting layers on a side of the first die to at least one contact of the second die conducting layers on a side of the second die. As used herein, the term contact includes any interface such that it encompasses both direct coupling and indirect coupling. Direct coupling methods include but are not limited to rod, ball, dual balls, bar, cylinder, bump, slug, conductive contact pads, terraces, fiber optic cable, and carbon nanotubes. Indirect coupling methods include wireless plus inductive and capacitive. Wireless methods include microwave, millimeter wave, and photonic. For example, a contact can be a conductive contact in one embodiment but also can be the interface with an active element such as a photonic device.

The interconnect structure can vary in shape and size, and may be selected from at least one of the group consisting of: rod, ball, dual balls, bar, cylinder, bump, slug, and carbon nanotube. Each die can have multiple sides and the interconnect structure is coupled to at least one of the sides.

The die can also have features to facilitate mating of the interconnect structures such as dogleg cuts, grooves, notches, enlarged contacts, conductive contact pads, stepped vias, and terraces.

The die may include at least one three state bus coupled to the interconnect structure allowing controlled fanin/fanout. The die can also be cut or tapered at an angle that may facilitate the coupling of the interconnects. For example, the first die can be cut at a first angle and the second die can be cut at an opposite angle. The term cut as used herein refers to the various manners in which the die can be shaped and includes the mechanical schemes such as cuts by saws as well as cuts by etching processes and cuts and/or ablation by lasers of appropriate wavelengths and powers. In one embodiment, the first die and/or the second die have an angled die edge, and the slug has a corresponding angled slug edge, wherein the die edge and the slug edge are intended to facilitate mating.

Furthermore, at least one other die can be coupled to at least one side of the first die and/or the second die. There can be any number of die, wherein each die has multiple sides, and wherein any of the sides of any of the die can be coupled directly or indirectly to each other.

The system may further include active elements in each of the first and second die providing indirect coupling, wherein the indirect coupling can be inductive coupling, capacitive coupling, and wireless communications. As used herein, wireless coupling and wireless communications refers to all forms of communicating in the fields of millimeter wave communications, photonic communications and microwave communications.

Another embodiment of the invention is a method for coupling at least two die, comprising forming a first die having a plurality of conduction levels and a plurality of dielectric levels, forming a second die having a plurality of conducting levels and a plurality of dielectric layers, interconnecting at least one of the conductive contact pads of at least one of the conducting levels of at least one side of the first die with at least one of the conducting levels of the second die. The interconnecting enables signals originating in at least one of the conduction levels of the first die to be coupled to at least one of the conduction levels in the second, die without having to traverse all intervening conduction and dielectric layers of the first die and the second die.

The method can also include interconnecting simultaneously to couple to more than one other die, and further comprising processing three state operations.

In another embodiment, the interconnecting from one of the first die conducting levels to at least one of the second die conducting levels is non-planar. Non-planar indicates that a conducting level from one die can go to any of the conducting level on another die and is not merely a planar coupling mechanism.

The interconnecting can be indirect coupling such as inductive coupling, capacitive coupling, and wireless communications. In one embodiment the wireless communications is provided by an optical device on the die, wherein the optical device can be, for example, PIN devices, MSM devices, Edge Emitting Lasers and Vertical Cavity Surface Emitting Lasers.

Another embodiment of the invention is an interconnect system for coupling between die, comprising a first die having a plurality of conducting layers and dielectric layers and a second die having a plurality of conducting layers and dielectric layers. There is at least one interconnect structure coupled on a first end to at least one of the first die conducting layers on a side of the first die, wherein the interconnect structure is coupled on a second end to at least one of the second die conducting layers on a side of the second die, and wherein the interconnect structure electrically couples the first die to the second die.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements.

FIG. 2a is a perspective view of three die interconnected on the sides by connection balls with slanted die walls to aid in ball placement according to one embodiment.

FIG. 2b is a side view that illustrates the die interconnection by connection balls for angled dies and various ball sizes according to one embodiment.

FIG. 3a depicts an embodiment of two die cut with a notch section to accommodate a larger interconnects along with a smaller size interconnects according to one embodiment.

FIG. 3b shows four die interconnected by interconnects of different sizes using again dogleg or notched cutback recesses to accommodate the larger interconnects and couple multiple die and multiple layers according to one embodiment.

FIGS. 6a-e shows elements of mask layers to create the stepped via flanges according to one embodiment.

FIG. 9a illustrates a multi-layered interconnect device termed a slug and the relationship to one die, configured in accordance with one embodiment of the invention.

FIG. 9a illustrates a multi-layered interconnect device termed a slug prior to being coupled to die, configured in accordance with one embodiment of the invention.

FIG. 9b illustrates the slug coupled between die and configured in accordance with one embodiment of the invention.

FIG. 10d shows an active element slug (which could itself be another die) interconnect configuration with terraced coupling between the slug and one die and non-contact coupling using photonic, microwave, and/or millimeter wave devices to connect to other die according to one embodiment of the invention.

DESCRIPTION

The methods and embodiments of die interconnections disclosed herein enable improved circuit designs with better performance and ease of manufacturing. Please note that figures are only a few of the possible embodiments and are presented to demonstrate features of the invention. The figures are not drawn to scale. In particular some parts are markedly misplaced or drawn larger or smaller than normal so as to emphasize certain points.

The term die is loosely used herein to refer to any substrate(s) including but not limited to dies in the usual sense but also, for example, substrates containing so-called hybrid devices or even only passive devices. The term chip(s) is sometimes used interchangeably with the term die. The term die may imply more than one such structure. Likewise, the use of the term "interconnect" refers to the coupling among die and is not limited to any particular form of interconnecting structure. Also, the term "signal" is used to designate any type of communication among dies in the package. Some of the particular forms include digital, analog, microwave and millimeter wave, photonic, waveguide signals of various mode types and polarizations, as well as DC power. The term signal may also include inductive and capacitive coupling techniques.

In addition, terminology regarding conducting layer (CL) and dielectric layer (DL) are used for convenience and there is no significance to the variation in the pattern used to denote the conducting layers. According to certain embodiments the lower layers of the die containing the active and/or passive elements and the substrate are not shown, but these are typically located at the bottom of the conducting layer "stack." Moreover, the conducting layers are often shown as a slab like structure of conducting material for clarity of explanation. It is fully recognized that multiple fabrication methods are possible, including variations of the Damascene process. The manner of fabrication does not affect the functionality of the present invention.

It is understood that a configuration in which multiple fanouts is described could generally be reversed to permit multiple fanins. Unless noted otherwise in what follows the term interconnect or listing of any one type refers to any of the many types of interconnects both direct, such as balls, rods, bars, cylinders, bumps, slugs, and carbon nanotubes, and indirect such as photonic, microwave, millimeter wave, capacitive, and inductive.

Figure 1A:
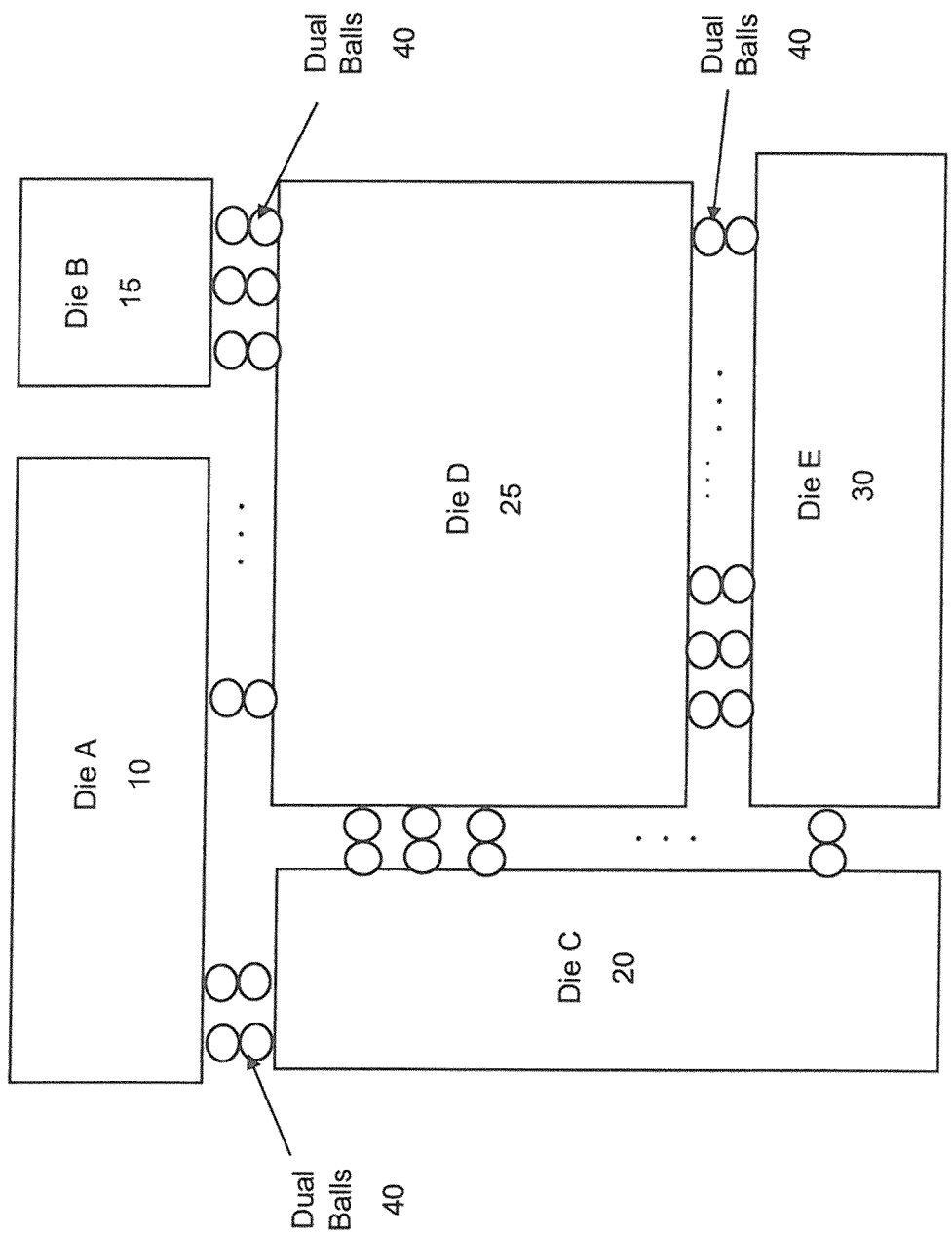
FIG. 1a is a perspective view of a plurality of die interconnected by corresponding balls or rods or other structures according to one embodiment of the invention.

Referring to FIG. 1a, the top view perspective shows several die 10, 15, 20, 25, 30 of varying shapes and sizes all coupled by a plurality of interconnect balls 40. The side connection structures 40 interconnecting the die 10, 15, 20, 25, 30 avoid the planarity problem that exists with trying to properly align solder balls to the surface of the high layer count dies, as well as to those with different thicknesses due to different layer counts and different starting wafer thicknesses.

In this embodiment, the interconnects 40 are a pair of connecting balls, wherein various side interconnects are detailed. Die 10, 15, 20, 25, 30 can have numerous layers and differing heights across the surface of the die 10, 15, 20, 25, 30 making solder ball connections On the topmost active surface of the die difficult, whereas the side interconnect 40 does not depend upon the planarity of the top of the die. Connecting on the sides, and more particularly to conducting layers on the side, also eliminates the excessive travel length of a signal traversing through the many layers of the die.

The solder or other attachment interconnect 40 between the die 10, 15, 20, 25, 30 is shown as two ball structures, wherein a ball would be deposited on one die at a certain layer level and a corresponding ball would be placed on the adjacent die at a certain layer, and wherein the two balls would be mated to each other thereby coupling the two die. The term ball is used to denote any object used for interconnect which has some form of rounded or arcuate surfaces including a bump, and it may or may not be elliptical in cross-section.

A number of types of interconnects are presented herein many of which can be used in combination, including balls, rods, bars, bumps, carbon nanotubes, and other similar structures provide direct coupling. Thus, single balls, multiple balls, rod like structure, bars, nanotubes and other similar structures, or some combination thereof are within the scope of the invention. Thus, although FIG. 1a shows balls 40 on each die 10, 15, 20, 25, 30 butting against balls 40 on adjacent die, a further embodiment is an implementation in which only one ball is used to connect the two adjacent die which may be preferable for manufacturability.

For illustrative purposes, certain dies for 125 and 150 millimeter wafers are typically 14 mils (thousandths of an inch) or about 350 microns thick. Solder balls used for connections are currently only 40 to 50 microns or approximately one-seventh ($\frac{1}{7}$) of the size of the wafer, however the size of the solder ball can vary depending upon the equipment used to deposit the balls. Ball sizes such as 5 microns or less are within the scope of the invention as the intent is to couple between adjacent die and improvements in the manufacturing technology will allow very small interconnect sizes for the interconnect 40. For further example, 200 and 300 millimeter wafers that are typically 625 microns and 720 to 750 microns thick respectively, have active layers that are 10 microns thick. These larger thicknesses mean there is more margin with respect to implementing some of the features of this invention. Ultra-thin die represent a further embodiment.

It should be appreciated that the interconnect dimensions are smaller than the 4 mil or 100 micron bonding pads currently used, and thus have correspondingly lower capacitance. Typically, most of the electrical activity takes place within 20 to 30 microns of the surface of the wafer, although it varies widely and may be much deeper in many circumstances. DRAMS for example use trench isolation that goes to a depth of greater than 10 microns. Some 300 mm wafers have conducting and dielectric layers that are 10 microns thick.

By way of further example, die with eight or more metalization layers plus two or more silicide conducting layers with concomitant nine to eleven dielectric layers plus twenty or more layers to form the actual transistors can have active regions in the 300 microns region. Thus, the vertical dimensions of the present invention are well within the range of that which is commonly practiced.

Figure 1B:
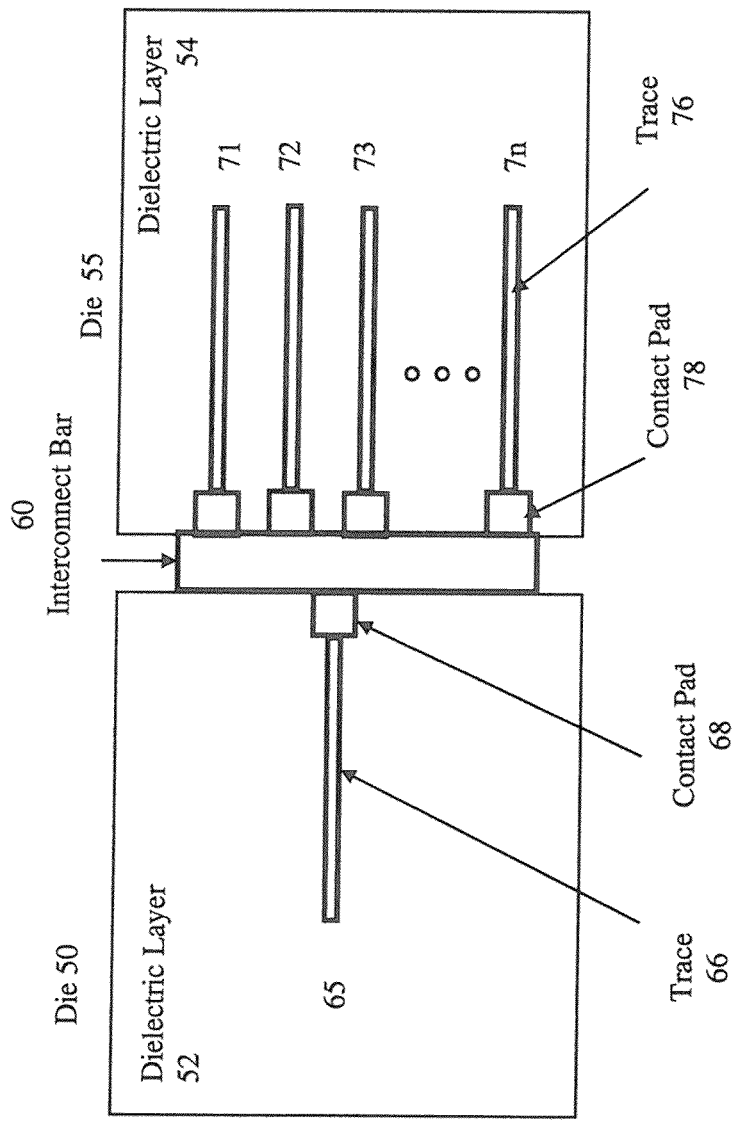
FIG. 1b is a perspective view of a plurality of die interconnected by corresponding balls or rods or other structures showing multiple fanouts according to one embodiment of the invention.

FIG. 1b illustrates multiple fanout and busses that are driven and electrically coupled according to one embodiment, wherein a signal 65 on one die 50 fans out to inputs 71, 72, 73, . . . 7n on another die 55 through an interconnect bar 60. As depicted, a signal 65 along a conducting line trace 66 on dielectric layer 52 of one die 50 is electrically coupled to a contact pad 68 that is coupled to an interconnect bar 60. The interconnect bar 60 is then electrically coupled to at least one corresponding contact pad 78 associated with at least one respective conducting line trace 76 that is associated with the signals 71, 72, 73, 7n on a dielectric layer 54 of another die 55. The signals 71 72, 73, 7n could also go to other logic on-chip or off-chip. By way of one example, if any of the signals 71, 72, 73, 7n are inputs to a three-state bus, signal 65 is driving that bus. The interconnect bar 60 need not couple all of the signals 71, 72, 73, 7n from one die 55 to a single signal 65 on another die 50, and in other embodiments there may be more than one signal from one die that is coupled to a section of interconnect bar and fans out to at least one of the signals on another die. Other variations employing a combination of interconnect bars and single interconnects such as balls and rods are also within the scope of the invention.

The contact pad 68 as described herein is part of the broader contacts described herein which includes not only conductive pads and enlarged contact areas, but also includes active element contacts.

Figure 1C:
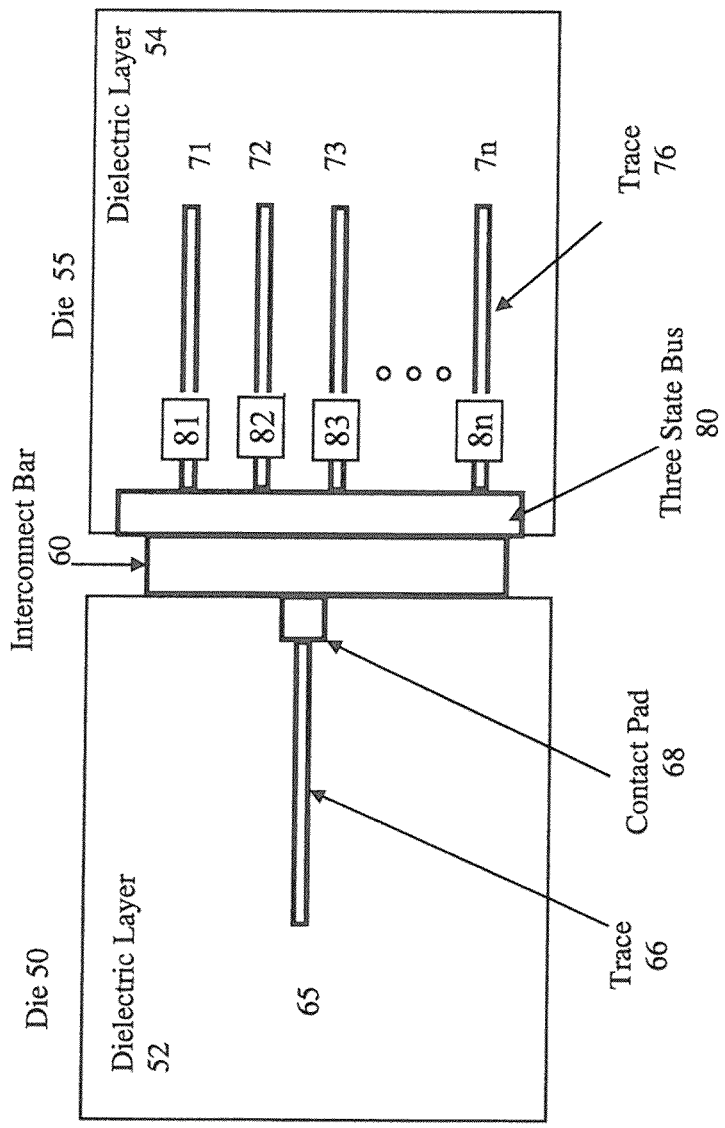
FIG. 1c is a perspective view of a plurality of die interconnected by corresponding balls or rods or other structures showing multiple fanouts with the fanouts operating as part of a bus from which one or more signals could simultaneously be selected according to one embodiment of the invention.

Another embodiment is illustrated in FIG. 1c in which input signal 65 drives a three-state bus 80 which has controls 81, 82, 83 . . . 8n which determine which of elements 70, 71, . . . 7n write or read (e.g.: charge or discharge) to/from the bus. The signal 65 is electrically coupled via a trace 66 and contact pad 68 disposed on a dielectric layer of one die 50. The interconnect bar 60 couples the signal 65 from the first die 50 to the second die 55, wherein the three state bus 80 having the controls 81, 82, 83, 8n allows control as to the coupling of the input signal to one or more of the input signals 71, 72, 73, 7n. The conducting traces 76 are deployed on the dielectric layer 54 of the second die 55.

Figure 1D:
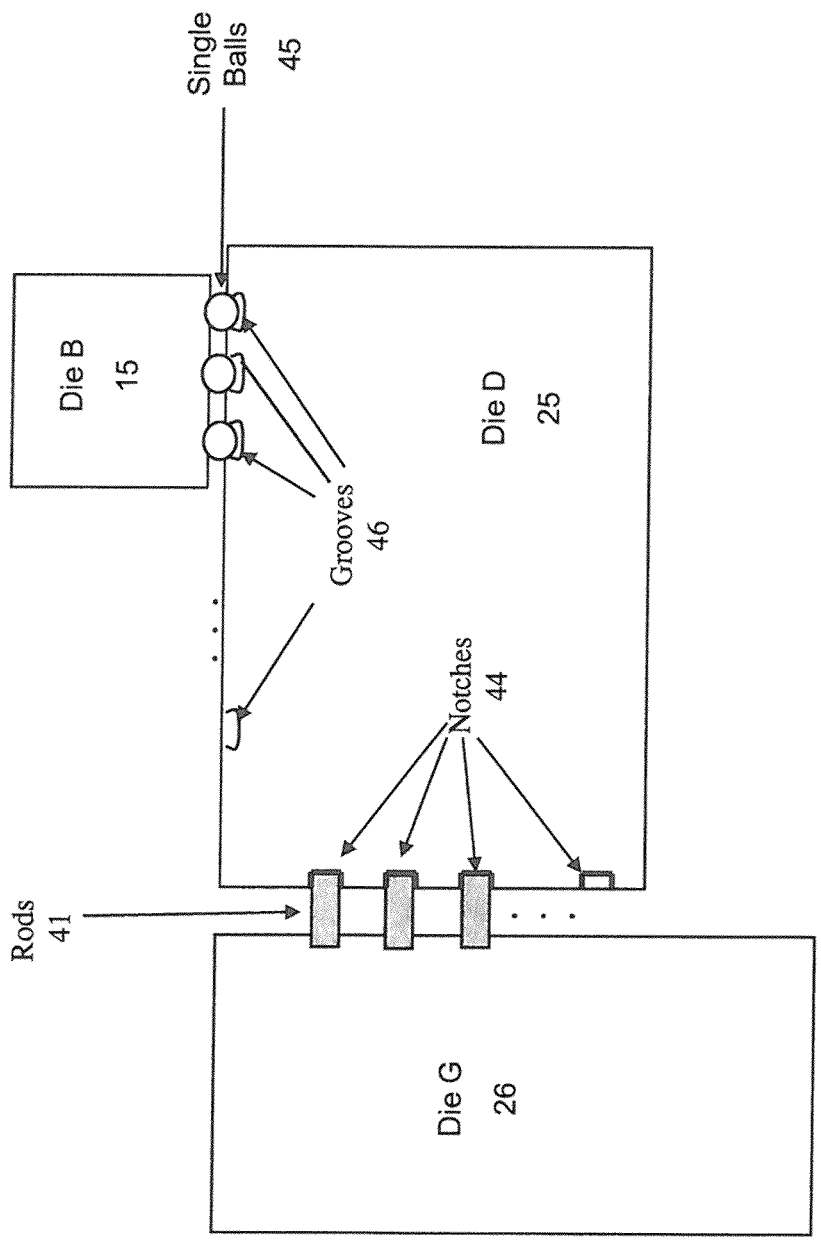
FIG. 1d a perspective view of a plurality of die interconnected by corresponding balls or rods or other structures illustrating lateral localizing the interconnects according to one embodiment of the invention.

Referring to FIG. 1d, a further embodiment shows grooves 46 and notches 44 in the die 25 to position balls 45, rods 41, and other interconnect structures if necessary in one or more implementation. In this particular embodiment, the die 25 has grooves that facilitate the mating of the single balls 45 to electrically couple with another die 15. The die 25 also has notches 44 that facilitate the mating of the rods 41 that couple to another die 26.

FIG. 2a is intended to illustrate some of the variants applicable to the present invention. Referring to FIG. 2a, a side perspective view is illustrated noting that the interconnects 230 couple between several adjacent die 200, 210, 220. As shown, multiple adjacent die can be operatively coupled to each other via the side interconnects 230 and the angles and positioning of the opposing and proximate die 200, 210, 220 do not have to be equivalent. There can be any number of side or lateral interconnects 230 that can couple a certain layer of one die to a layer on an adjacent die. The interconnection can couple layers that are at approximately the same level, approximately parallel, or can couple layers with some vertical difference depending upon the angles and sizes and types of the coupling structures. Furthermore, the use of slugs and non-direct contact structures such as active element contacts are detailed herein and allow other coupling options.

Referring again to FIG. 2a and FIG. 2b, the walls 240 of the die 255, 260 are slanted to aid in the interconnect 230, 250 placement. In more particular detail, FIG. 2b shows a side view perspective of one embodiment of the present invention for multi-layered die 250, 260. In this embodiment the multi-layered die 255, 260 have an angled or tapered die edge 240 between the opposing and proximate die. There can be different sized interconnects 250 as the spacing between the adjacent die 255, 260 varies due to the angled walls 240. Other interconnect structures 250 such as rods, bumps, bars, and carbon nanotubes can be used alone or in combination with the other interconnects employing the angled wall configuration especially if coupling among specific layers of the die having different vertical heights.

It should be readily apparent that one or all sidewalls 240 of each the die 255, 260 can be tapered and the taper angle can be calculated according to a desired spacing of the interconnects 250 for a particular layer. In this particular embodiment with at least one of the adjacent die having a tapered die edge or sidewall 240, the interconnects 250 can be varied in size to accommodate the difference in the separation between the die 255, 260. While die traditionally have four sides, any polygonic die benefit from the present interconnect invention.

This angled or tapered wall 240 can be fabricated by arranging the width of adjacent stacked layers such that an upper layer can be slightly offset, thereby resulting in a tapered, terraced, or angled appearance. Alternatively, the die edge 240 can be cut using a wafer saw and/or a laser ablation "saw" depending in part on the materials used. It is also within the scope of the invention to, employ non-linearity to the tapered wall such that it can have varying shape and accommodate lateral notches, steps or grooves (not shown).

Referring to FIG. 3a and FIG. 3b, a further embodiment for coupling die is illustrated, visually demonstrating single or multiple fanin/fanout capabilities. FIG. 3a shows two die 330, 340 with a dogleg cut 320 between the die. Small interconnects 300 couple the lower levels between the die 330, 340. A large interconnect 310 couples the die within the region of the dogleg cut 320. The dogleg cut 320 can be accomplished in many ways as is known in the art, such as by using a wafer dicing saw, laser ablation, or masking techniques as described herein. The large interconnect 310 provides one mechanism for multiple fanin/fanout by coupling layers to/from multiple die as shown in FIG. 3b.

FIG. 3b shows four die 350, 355, 360, 365 interconnected by balls 370, 375 of different sizes using again dogleg cutback recesses 320 to accommodate the larger ball 370 and/or other structure sizes 375. The two die on top 350, 355 have been flipped over. The interface area 380 between the top die 350, 355 and the lower die 360, 365 can be coupled using interconnects such as balls or other structures thereby showing top and side coupling of die using interconnects. The interface area 380 in one embodiment may also represent a heat conductor/spreader or interposer.

Referring again to FIG. 3b, there are four die 350, 355, 360, 365 that are coupled to each other via a plurality of large interconnects 370 and small interconnects 375. In addition, there is a heat conducting layer 380 that provides a thermal transfer mechanism. While the small interconnects 375 can be used to couple between conducting layers of proximate die, such as die A 350 and die B 355, the large interconnect 370 allows for coupling to one or more conducting layers of more than two die in this case to all four die 350, 355, 360 and 365.

The heat conducting layer 380 which can also function as an interposer can be brought out to a cold plate or other cooling mechanism such as die liquid cooling. Moreover similar to the multiple fanouts, bar connector could be used in conjunction with connectors 370 and 375 and the shape could be, for example, spherical, cylindrical or rectangular.

The dog leg recess 320 not only allows larger connecting structures but also provides a means to locally position the ball, rod, bar, and/or other structures in the vertical dimension. And, it is not restricted to multiple fanouts.

Referring again to FIG. 3b inductive coupling is shown for both top and side. Embedded in the top and sides of dies 350, 355, and 365 are inductive couplers, namely Vertical inductive coupling elements 382 and Horizontal inductive coupling elements 384. There is a difference between the vertical and horizontal because the former may span more than one conducting layer. The transposer/heat remover 380 might also be removed where horizontal inductive elements 382 exist depending upon the amount of separation of the two die as well as other factors described herein. A heat conductor/spreader or interposer is known in the art and some embodiments further include conductive elastomers.

As is well-known, inductance slows the signal down and is often deleterious. However, inductance can be used for non-direct (also termed indirect contact) interconnect as shown below in FIG. 3b. It is common in analog microwave and millimeter wave devices to build inductive circuit elements on chips. Some of the design factors for the inductors include the degree of coupling and the implementations depend upon several factors including the frequency, the permeabilities of the materials being used, the proximity to each other, and the currents flowing.

In addition to spiral inductors, common in microwave and millimeter wave applications, it is also possible to use serpentine and interdigitated structures.

For field effect transistors the serpentine and interdigitated structures enable high width over length ratios, which is a measure of drive capability for a given feature size and technology, and provides these favorable ratios in a small form factor. For a further description of this for background purposes, see E. Hollis: "Design of VLSI Gate Array ICs", Prentice-Hall, 1988. However, similar structures can be used to provide inductors albeit without, of course the sources and drains used in the transistors. The serpentine structures according to one embodiment herein correspond to the gates of the transistors. The material used for the inductors would most likely be dissimilar from that used for the gates.

Figure 4:
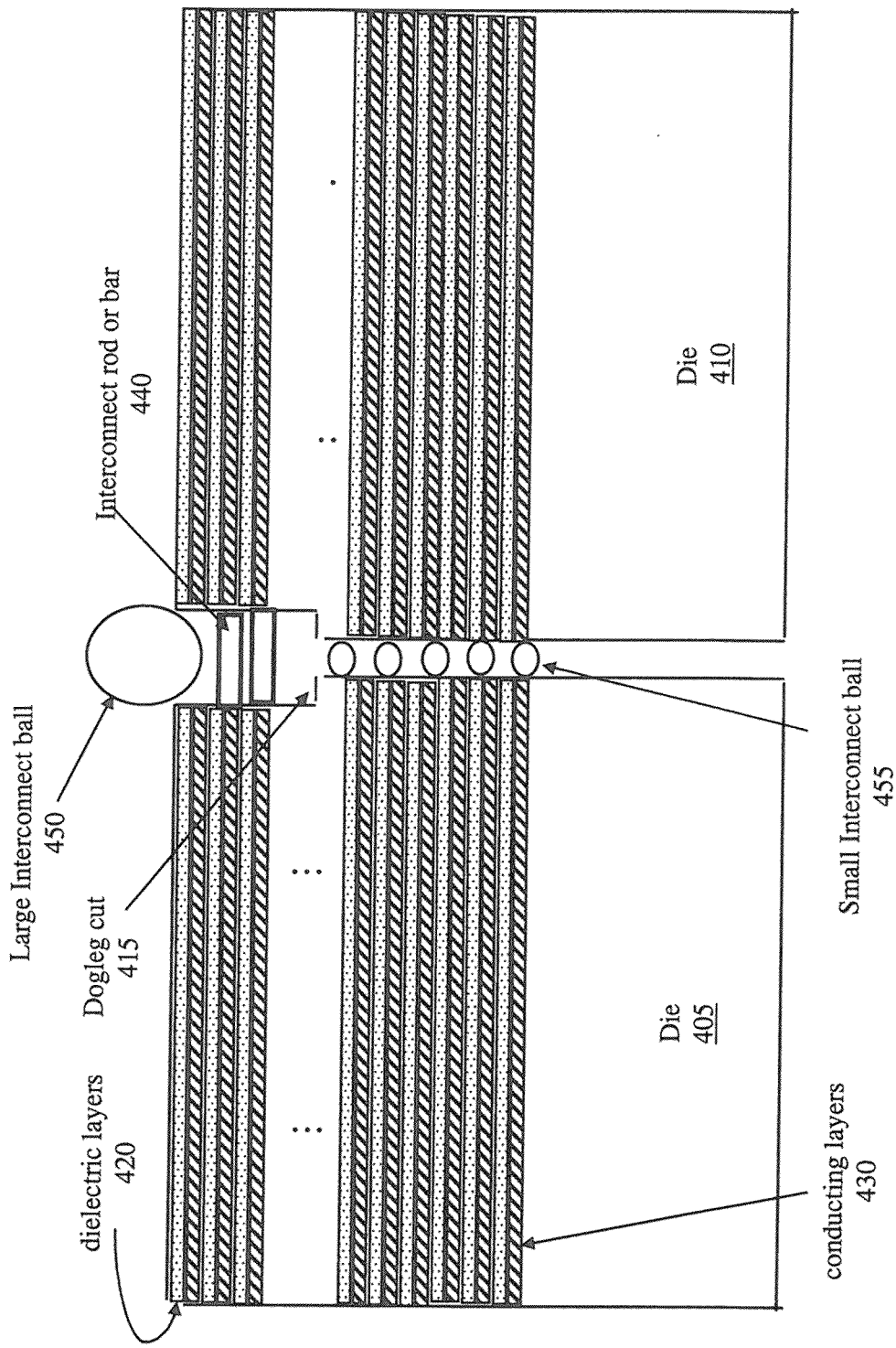
FIG. 4 is a side view of two die interconnected by different size interconnects and a structure showing both conducting layers and dielectric layers according to one embodiment.

A cut-away side view perspective of a vertical slice of a first die 405 and a second die 410 is shown in FIG. 4 showing a multi-layered die according to one embodiment. A plurality of conducting layers 430 such as metal, polysilicon, and silicide are interspersed with a plurality of dielectric layers 420 and are vertically stacked to form each of the die 405, 410. The materials and types of layers depend upon the design criteria and fabrication techniques employed. There can be a number of small interconnects 455 coupling any number of the conducting layers. Interconnect rods 440 can also be employed to couple adjacent conducting layers 430 between the dies. Also shown in a dogleg cutout 415 with a large interconnect 450 that is used for coupling to other die (not shown). The width of the layers 420, 430 can be varied to accommodate certain design criteria. For example, the use of the large interconnect 450 may require a thicker dielectric layer about the conducting layer that interfaces with the large interconnect to ensure it does not couple to other conducting layers in the same die. It should be readily apparent that two die can be interconnected by different size balls and in combination with a rod or a bar is well within the scope of the invention. The variety of configuration options may be useful for multiple fanouts and bus addressing.

FIG. 4 also illustrates both conducting layers and dielectric layers that form the stack. With respect to the conducting layers, a variety of materials are used for conduction, and qualities include conductivity, adhesion, impenetrability by other materials, well defined stop etching parameters, step coverage difficulties, compatibility with existing or proposed processes, and manufacturability. For pure metal layers, copper which has a melting point of 1083 deg C. and refractory metals such as tungsten, titanium, molybdenum, which have melting points around 2500 deg C. are typically used. They are also used over polysilicon to form silicides which have greater conductivity than the polysilicon alone. Because silicides are native to the self-aligned gate (SAG) process, two such layers are generally used to aid in conduction for relatively short distances. Variations of the Damascene process in which metal is deposited into indentations in dielectric are often used. The term conducting material thus typically refers to various metals used in the process such as, but not limited to, Al, Cu, and refractory metals such as molybdenum, titanium, tungsten, as well as polysilicon, silicides, and other materials having satisfactory properties. Increasingly carbon nanotubes are being used partly because of superior thermal conductivity. Tools to enable greater precision of manufacture are constantly being developed and what may be limitations of the current state-of-the-art should not be used as a gauge to unnecessarily limit the present invention. Nonetheless, a permutation of what is shown in previous and other figures enable greater contact sizes to be used.

Figure 5:
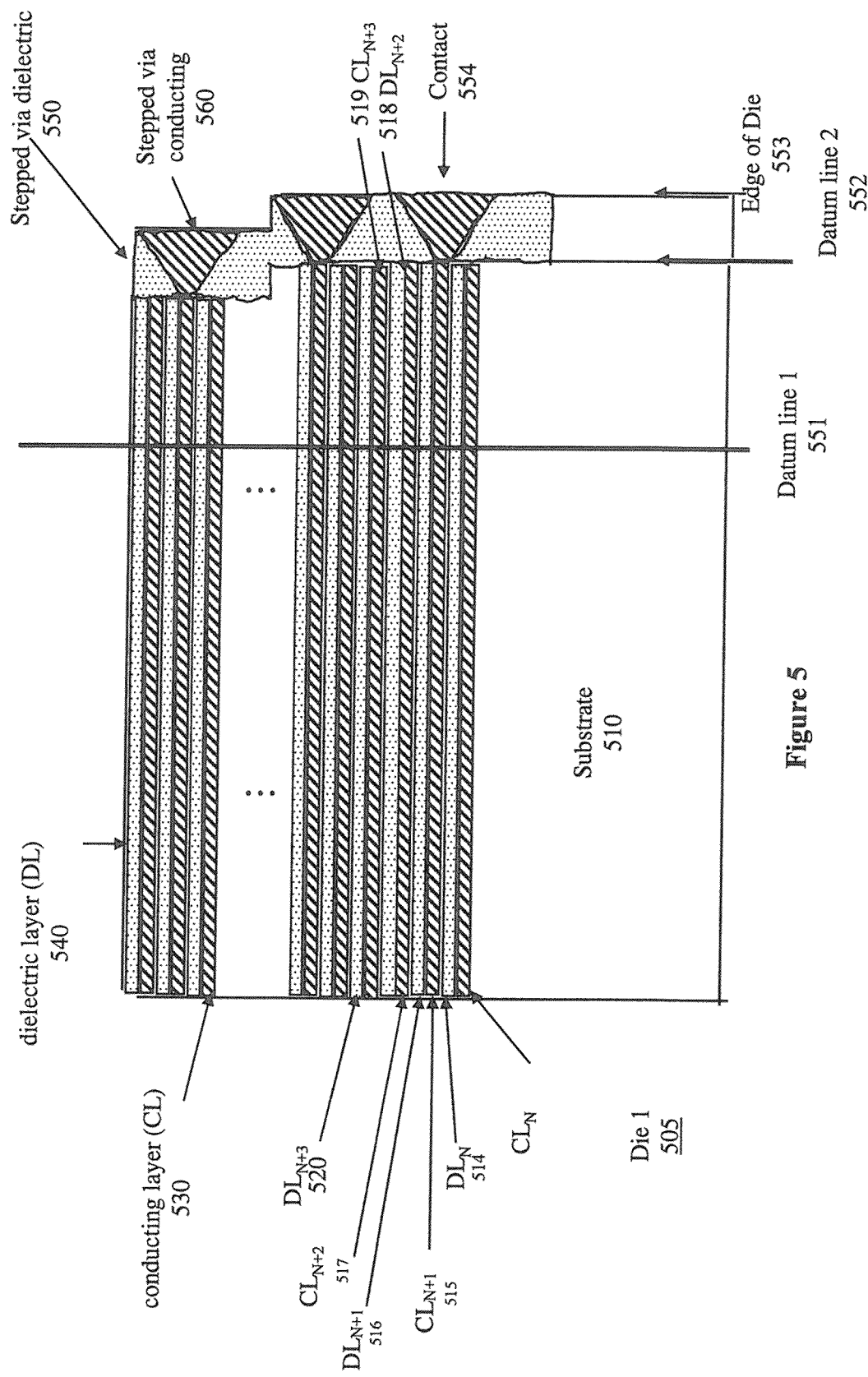
FIG. 5 shows a side view perspective 'slice' of a die with contact "flanges" created using stepped vias or other techniques according to one embodiment.

As shown in FIG. 5 the contacts to the die extend over greater than one conducting layer as shown. The method of doing this is straight forward and employs a variation of what are known as "stepped vias."

The method detailed herein shows the creation of an enlarged tapered contact pad, and a similar method can be used to create other non-tapered contact pads. The method depends upon a number of factors including but not limited to equipment types. In general, smaller contact pads are desired for several reasons, such as lower capacitance and hence faster speeds as well as the ability to put more on a given die of slug.

The formation of a die in one embodiment of the invention is illustrated in FIG. 5 in which the subscripts denote the various mask layers. In this embodiment, the connections to the sides of the die are shown wherein a signal on a conducting layer is brought to the interconnect by laying out that conducting layer mask appropriately. In this embodiment the interconnections along the sides of the die are provided by creating bonding pads via stepped vias. The bonding pad embodiment for the I/O is particularly useful when the interconnect dimensions exceed the interlayer spacing and it would difficult to place an interconnect on the side and only interface with a single conducting layer.

Referring again to FIG. 5, a plurality of dielectric layers (DL) 540 and conducting layers (CL) 530 are vertically stacked on the base substrate 510 in the formation of the die 505. Because the focus of this invention is on interconnect, the term "substrate" is loosely used to include the active element layers not shown in the Figures.

The stepped vias according to this embodiment is formed from two or more successive dielectric masks and having stepped via conducting portions 560 and stepped via dielectric portions 550. The datum lines 551, 552 and the edge of die 553 show the reference planes in relation to the die 505. As depicted, there are a number of conducting layers 530 commencing with $CL_N$ 513 formed on the base substrate 510 followed by a dielectric layer $DL_N$; conductive layer $CL_{N+1}$; then dielectric layer $DL_{N+1}$; wherein the processing continues until the upper dielectric layer.

Stepped vias are a standard masking technique and are normally employed to mitigate the effects of poor "step coverage" due to poor aspect ratios when connecting among layers. As known in the art, a stepped via is a vertical opening which can be filled generally but not always with conducting material which is larger on one or both ends than in the middle. Typically they are used to prevent the deadly "step coverage" problems in going from one conducting layer to another conducting layer. In one method, a dielectric layer which is not of full thickness is laid down and patterned with a hole of the size of the via desired. A second dielectric layer of thickness which when added to that of the previous partial layer gives the overall dielectric layer thickness desired is then put down. The via opening in the second partial dielectric layer is larger than that of the first partial dielectric layer and helps avoid the step coverage problem.

In this invention, techniques somewhat similar to those employed in the vertical stepped vias are used to create a "flange" contact from traces running to the side edge of the die. The flange is an enlarged contact area to enable more margin in interconnect using side interconnects.

It should be readily understood that while only one trace going to a side bonding contact is shown in FIG. 5 and FIG. 6, more than one such trace could be made to the same contact from either the same or different conducting layers encompassed by the flange. This system provides yet another method for multiple fanin/fanouts.

One of the benefits of a stepped via is that the opening on one side of the connection is made larger than on the opposite side of the connection by simply having more than one mask for the via as is commonly done for vertical stepped vias. The stepped via thus provides a larger side area of the die for coupling to an interconnect. Furthermore, it can also establish a 'seat' for the interconnect, such as a rod, bar, bump, ball or other interconnect. As noted herein, any of the designs involving balls, rods, and/or other structures, may include "troughs" cut about the die to localize the placement of the structures.

Referring again to FIG. 5, the area between the reference planes for the datum line 552 and the edge of the die 553 includes areas of expanded height stepped via dielectric portion 550 and expanded height stepped via conducting portion 560 wherein the conducting portion 560 forms the over-sized contact 554.

As noted herein, while it is convenient conceptually to describe conducting layers, all conductors whether contacts or lines are enclosed in dielectric material except when they join with other conductors. Thus the dielectric layers actually extend into the conducting layers such as noted by the Damascene process, or are deposited by the next successive dielectric layer around the conductors etched from the conducting layer.

The formation of the stepped via of FIG. 5 according to one embodiment is shown in more particular detail in FIGS. 6a-6c which illustrates a top view perspective of a vertical slice showing how contact 554 on conducting layer $CL_{N+1}$ 515 is enlarged to give more margin in placement of the mating edge contacts. Note that just one enlarged contact pad is created from the process below. Even though it overlaps in this case two additional conducting layers above it, and if desired one or two below it, the enlargement could encompass just one such conducting layer either below or above it. Thus there is a large amount of flexibility to accommodate a wide variety of needs and precisions of equipment types.

FIG. 6a thus shows in effect 2 successive layers, DLn and CLn+1. FIG. 6b shows only one layer, DLn+1 which is the next higher dielectric layer. FIG. 6c is similar to FIG. 6a in that it shows 2 layers, DLn+1 and CLn+2.

FIGS. 6a-6c show the formation of the stepped via in FIG. 5 but from a top perspective. The mask layers, as noted in FIG. 5, are vertically stacked conducting and dielectric layers that provide for the formation of stepped or non-stepped vias and the corresponding coupling via the interconnects (not shown). To avoid excessive repetition, only a portion of the enlarged contact 554 is shown.

In this example, referring to FIG. 5, the enlarged contact pad 554 is made to extend "upwards" to encompass two more conducting layers 517 and 519. It is isolated from other conducting layers by the dielectric layers 518 and 520. In each case, the conducting material from the next higher layer fills the hole in the dielectric purposely created for such filling by the respective mask for that layer.

Referring to FIG. 5 and FIG. 6a, trace 653 provides the inputs/output to/from the contact pad 654 is formed with conductive layer $CL_{N+1}$ 515. The trace 653 is shown surrounded by dielectric layer $DL_N$ 514 employing the Damascene process. If an older process is used, the trace 653 would be surrounded by the next higher dielectric layer 516 (not shown). The following is a description of one embodiment using the Damascene process. It will be readily apparent to those skilled in the art how the older processes can also be used.

Referring to FIG. 5 and FIG. 6b the contact pad layer 654 is processed with dielectric layer $DL_{N+1}$ 516 and further processing as is known in the art forms an opening 660. The opening 660 is provided in order for the conductive material such as metal to be deposited from the next successive upper conducting layer 517 $CL_{N+2}$. FIG. 6b shows the opening in $DL_{N+1}$ which will be filled by the next conducting layer $CL_{N+2}$ 517. For clarity in presentation, two different patterns are used for the $DL_{N+1}$ 516 material even though they are the same material. One embodiment provides for a portion of the larger opening in dielectric layer $DL_N$ to be closed off to provide part of the taper to the flange.

In FIG. 5 and FIG. 6c the deposition process is shown repeated for the upper edge of the pad 554 to make all the desired contacts and stepped vias. In each case the next conducting layer fills the hole in the preceding dielectric layer. Because of the high temperatures used in subsequent processing, copper and/or refractory metals may be used. FIG. 6c also shows that the void in dielectric layer $DL_{N+1}$ 516 has been filled with material from conducting layer $CL_{N+2}$ 517 to extend the flange into the $CL_{N+2}$ layer 517.

FIG. 6d and FIG. 6e show a second iteration of the above process steps depicted in FIG. 6b and FIG. 6c to further taper the contact flange according to one embodiment of the invention. FIG. 6e shows the void in $DL_{N+2}$ which has been filled with conductive material from 519 $CL_{N+3}$ and surrounded by dielectric material from 520 $DL_{N+3}$.

Referring to FIG. 6d, the processing continues having the opening 662 partially filled with dielectric material from the $DL_{N+2}$ layer 518. In FIG. 5 and FIG. 6e, the top of the flange is shown filled with conductive material $CL_{N+3}$ material 519. Similar masking steps are used to create other conducting pads/contacts. For example, to create the dogleg in the tops of dies 405 and 505, the masks would simply be appropriately dimensioned to shift the reference planes back. Further examples are described herein. It should be readily understood that the term contact includes not only the enlarged conductive contact shown in FIG. 6a-6e, but also includes the active element contact that may be processed in the die and provide for side edge communications.

Figure 7:
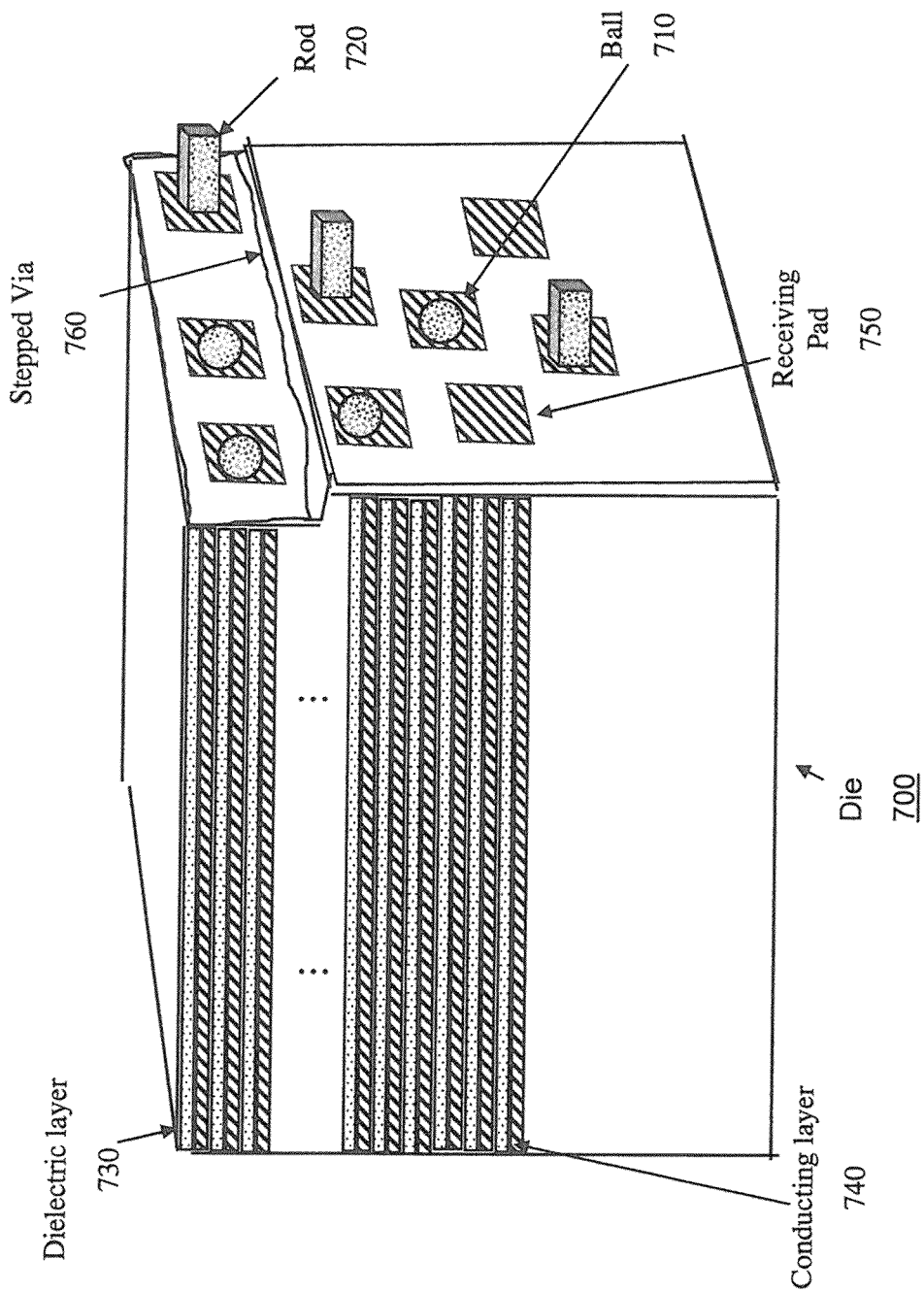
FIG. 7 shows a three-dimensional perspective view of a die with various structures and one dogleg recess according to one embodiment.

Another embodiment of the present invention is illustrated in FIG. 7. As previously described, a die 700 is formed from a vertical stack of layers of dielectric layers 730 and conducting layers 740. On the side of the die 700 there are a plurality of pads 750 and interconnects 710, 720. This embodiment shows both the interconnect balls 710 as well as rods 720 on the same surface. The pads are brought out from the respective conducting layer and the pads 750 can be positioned anywhere about the side of the die as shown and typically will be positioned with some separation from other pads 750. There can be more pads 750 than actual couplings to the balls 710 or rods 720, allowing for design flexibility. There can also be multiple pads 750 and interconnects 710, 720 coupled to a single conducting layer in order to allow multiple fanin/fanout. The pads 750 and the interconnects 710, 720 can be different sizes and shapes. The stepped via 760 is shown such that the side edge of the die for the stepped via portion is shifted in the horizontal plane.

The present invention has numerous applications and some are provided herein by way of illustration of a few of the possibilities. For example, one application relates to interconnecting photonic chips, such as Edge Emitting Lasers (EELs) and Vertical Cavity Surface Emitting Lasers (VCSELs) to indicate the type of arrangement and communication possibilities but is not to be construed as limiting.

Figure 8A:
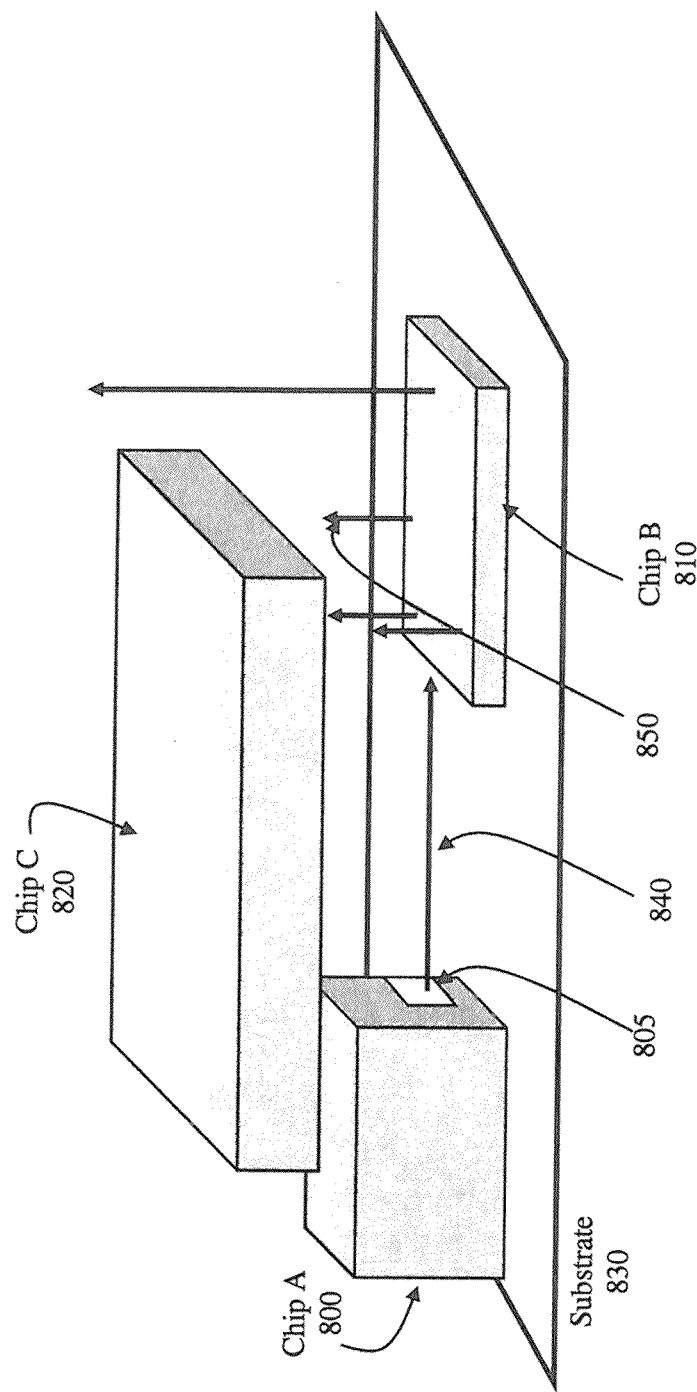
FIGS. 8a-8b show an application of the presenting invention in conjunction with photonic device structures wherein vertical beams emanate from VCSELs and horizontal beams emanate from EELs according to one embodiment of the invention.

Referring to FIG. 8a, there are three chips 800, 810, 820 proximate the substrate 830. A photonic emitter 805, such as an Edge Emitting Lasers (EEL), is embedded in at least one of the sides of the chip 800 and radiates signals 840 to a photodetector in another chip 810. The photodetector on the other chip 810 may be any of several types such as PIN photodetectors which are small and which have excellent D* ratings, which is a measure of detectivity. Edge Emitting Lasers can also function as photodetectors although they are not as good as PIN types.

In this example chip 810 contains another type of photonic emitter such as a Vertical Cavity Surface Emitting Laser (VCSEL). Unlike the Edge Emitting Lasers which radiate out the side, VCSELs radiate out the top of the chip. FIGS. 8a-8d are intended to show some of the options obtained by using side and top photonic devices, although each can be used independently.

In FIG. 8a, the photonic emitter such as a VCSEL radiates to a photodetector in die 820 and also to the top cover of the package. The reflection due to the latter would then spread the relatively narrow photonic beams into roughly omni-directional signals which could then be used to connect with non-adjacent die, if desired. Multiple beam photonic devices such as VCSELs are well-known.

Edge Emitting Lasers, VCSELs, and PIN photodetectors are very small. For example, the Edge Emitting Lasers are roughly the size of a conventional bonding pad, enabling hundreds of them to be used in a chip, if desired.

The small size also enables "active element packages." These are packages which contain communication devices. For example, photodetectors receive the signals from an Edge Emitting Lasers and/or VCSELs without the need for bonding wires. These signals are in turn be used for in-situ monitoring of signals as well as for communication directly to a printed circuit board (PCB) or other structure.

Referring now to FIG. 8a, as noted there is also a photonic transmitter such as a VCSEL on the second chip 810 that radiates one or more signals 850 to photonic detectors on another chip 820 and possibly also to a another device or to a cover (not shown) which will then turn the signals or beams into a semi-isotropic beam for transmittal to other chips within the package. Note that the inputs for the photonic devices could come from a rod, ball or other contact member as detailed herein.

Figure 8B:
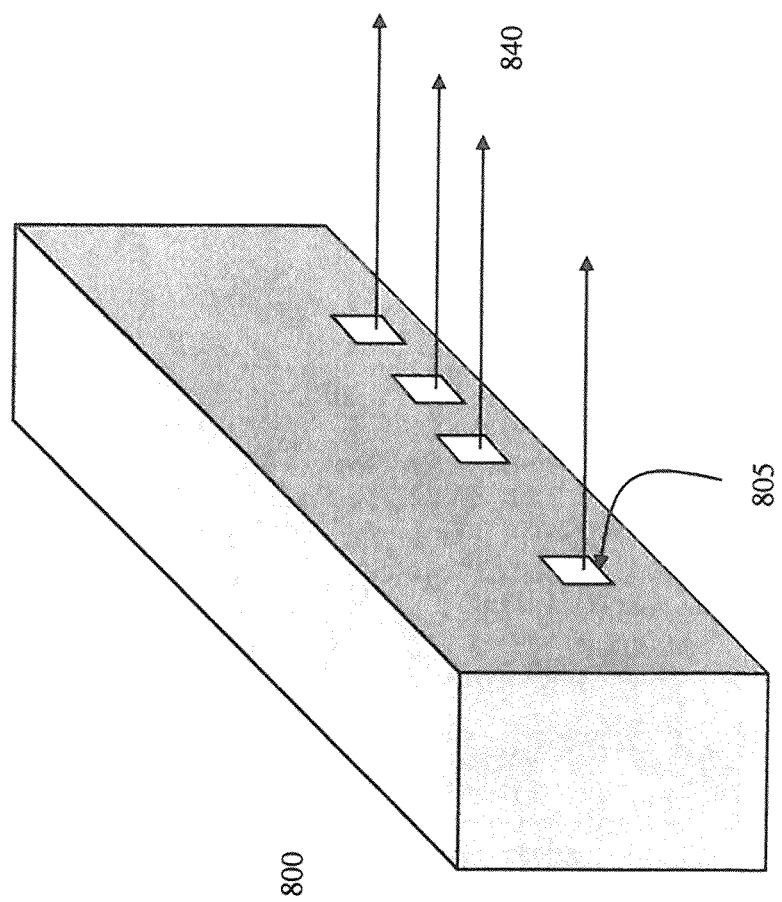

FIG. 8b shows a bus made up of photonic transmitter or transceivers 805 radiating signals 840 from the side of die 800 wherein the present invention permits the sideways communication ability between chips. The signals 840 can be unidirectional or bidirectional. The photonics communications can be implemented in numerous ways, such as digital spread spectrum, wavelength division multiplexing (WDM), or other techniques to enable simultaneous operation. According to this embodiment, the width of the photonic emitter device can be about 4 mils (100 microns), and there could be at least 75 or more on each edge of a 600 mil square die permitting the chip to communicate in four sideways directions in addition to transmission/reception from the bottom and top surface, thereby having a chip with communications in six planes of potential communication capability.

Figure 8C:
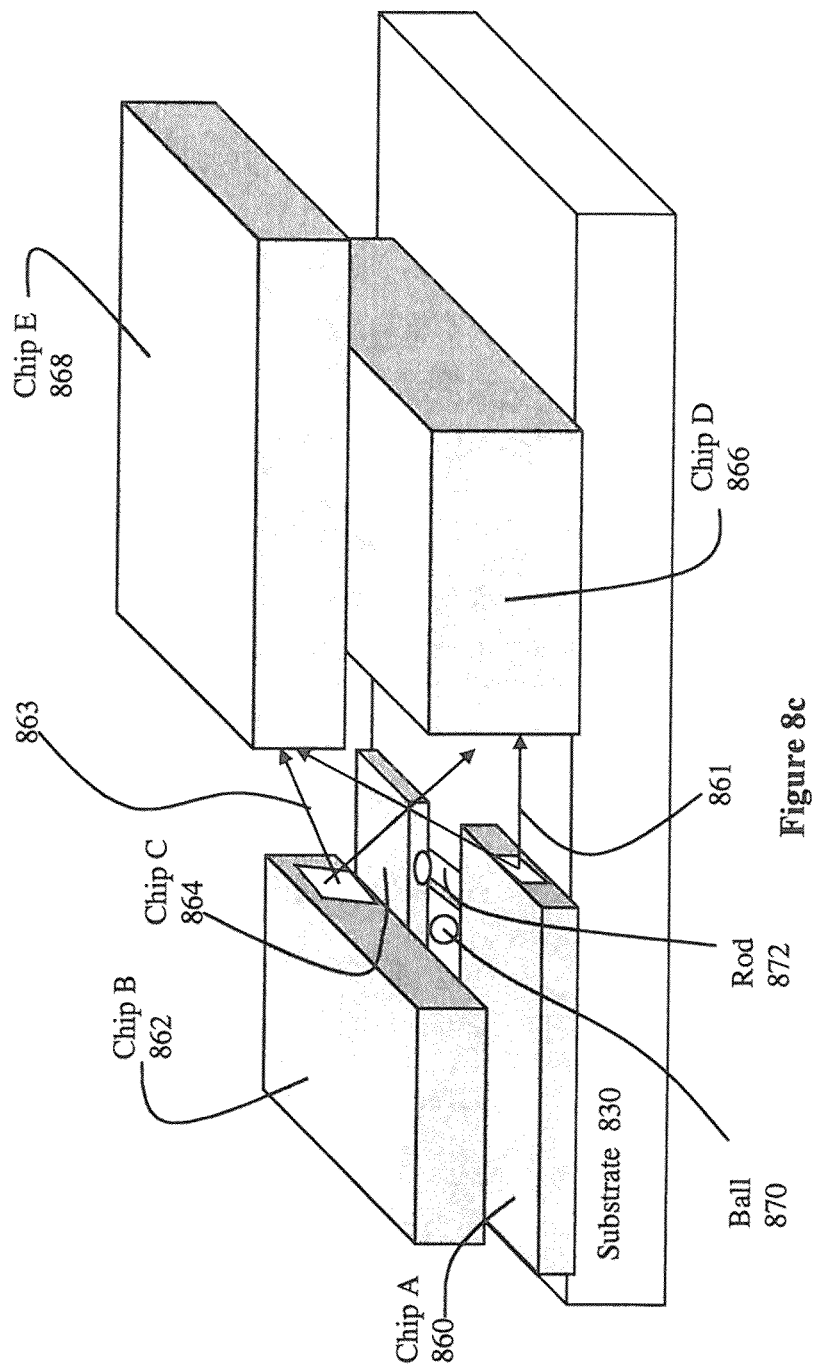
FIG. 8c depicts an application of the presenting invention in conjunction with photonic devices, microwave, millimeter wave, plus balls, rods, bars, and other structures according to one embodiment of the invention.

Referring to FIG. 8c multiple chips or dies 860, 862, 864, 866, 868 are shown having different shapes and of different thicknesses, which may be in part due to differences in numbers of layers and starting wafer thicknesses. In this depicted embodiment, a microwave or millimeter source in Chip B 862 radiates signals 863 to dies 866 and 868 with its relatively broad beam whose beamwidth depends on the combination of frequency, aperture size, and antenna type. Between Chip A 860 and Chip C 864 are interconnects on one of the sides of each having interconnects 870 and 872 coupling the chips. Coming out another side of die 860 are one or more Edge Emitting Laser or other photonic signals 861 whose beamwidth encompasses both die 868 and 866. Although the photonic transmitter or transceiver is shown on die 860 it could be on any one of the dies.

Figure 8D:
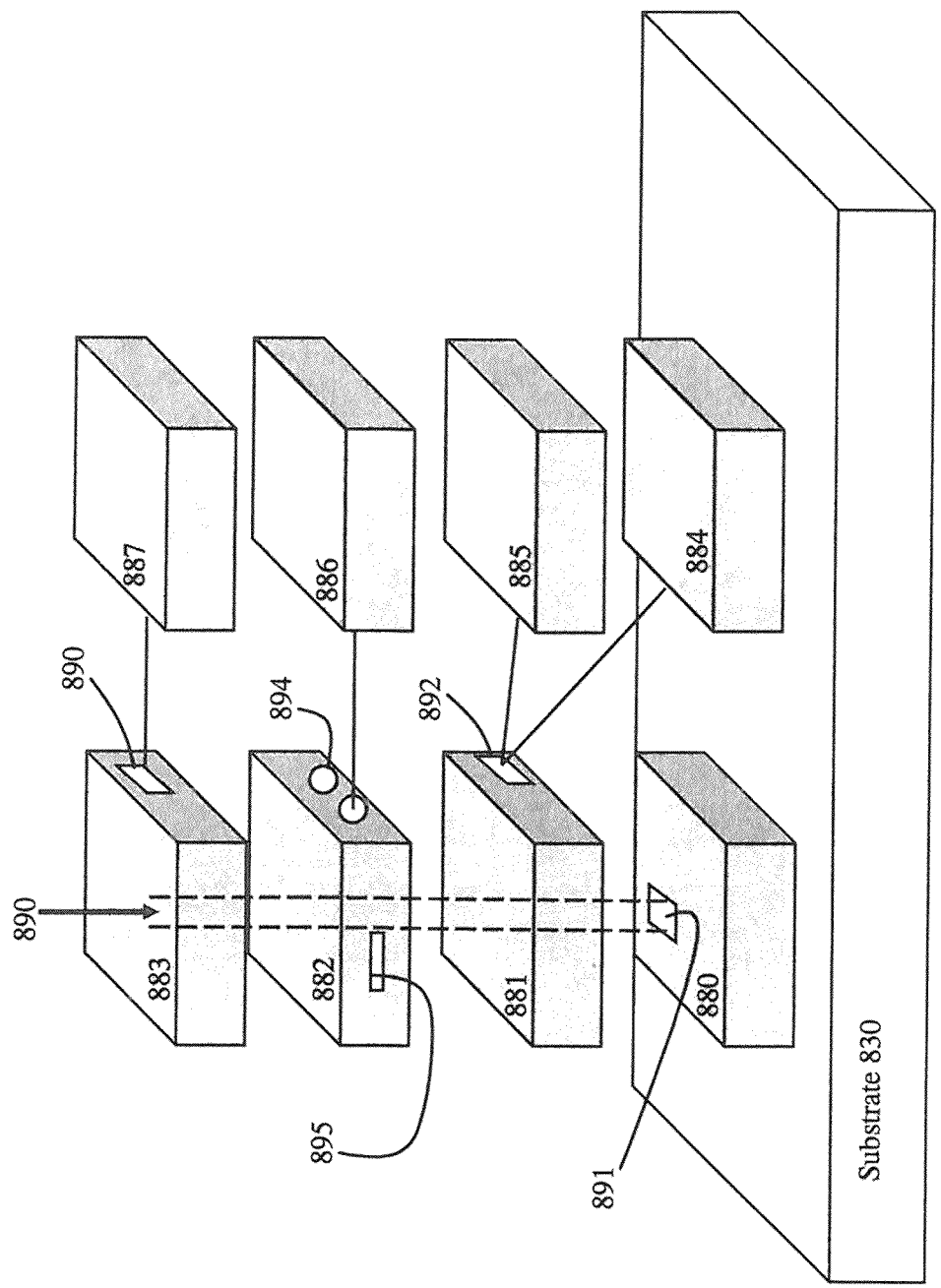
FIG. 8d shows multiple stacked die containing photonic device elements and microwave and/or millimeter wave devices according to one embodiment of the invention.

FIG. 8d shows multiple chips 880, 881, 882, 883, 884, 885, 886, 887 deployed about a substrate 830 and communicatively coupled to each other.

In this embodiment, one of more beams or signals 892 are derived from a photonic transmitter or transceiver 890 and transmitted to one or more of the chips. There can be one or more photonic detectors 882 on at least one of the chips that can intercept a portion of the beam 892 and extract the information therein. It should be noted that interposers have been omitted in the interest of clarity. As shown in this embodiment, there can be hole(s) through the chips or the chips can be transparent or translucent to the wavelength of the photonic signal 892 and a photonic detector or transceiver 891 can be located on one of the upper surfaces of the chip 880 to allow vertical transmission of data. While only one such photonic transmitter and one photonic detector are depicted, there may be many such photonic devices such as VCSELs and Edge Emitting Lasers integrated into the chips. Note that putting holes all the way through the die to enable beam transmission is a routine operation for many die types.

There are also interconnects 894 on the side of the chip that can be used in a contact or non-contact form and coupled to one or more of the other chips. These elements support the side edge communications capability as detailed herein.

The chips 880, 881, 882, 883, 884, 885, 886, 887 may be die of different shapes, sizes and thicknesses and arranged in two or more separate stacks. One embodiment illustrating some of the communications includes having the Edge Emitting Lasers 890, 892 in die 883, 881 respectively, and communicating with chips 887, 885 and 884. As noted, the vertical beamwidth, of the Edge Emitting Lasers 892 typically communicates with more than one chip vertically. However, the horizontal beamwidth which is much smaller can be limited by using Edge Emitting Lasers whose horizontal aperture size is large enough that only one die or even possibly part of one die is illuminated by the narrow beam. Thus, the present invention allows for one or more chips to communicate without direct contact with one or more other chips of varying heights, widths, depths and aspect ratios on the substrate or suspended above it as in the case of e.g., stacked die. This further includes communicating from multiple sides of the chips and can further include communications to off-chip resources.

Other side chip edge elements such as Edge Emitting Lasers 890, 892 can be used in other embodiments to communicate data and information. Such communications may be tunable and/or of a different wavelength depending upon the application or they may use a coding scheme such as digital spread spectrum.

Figure 8E:
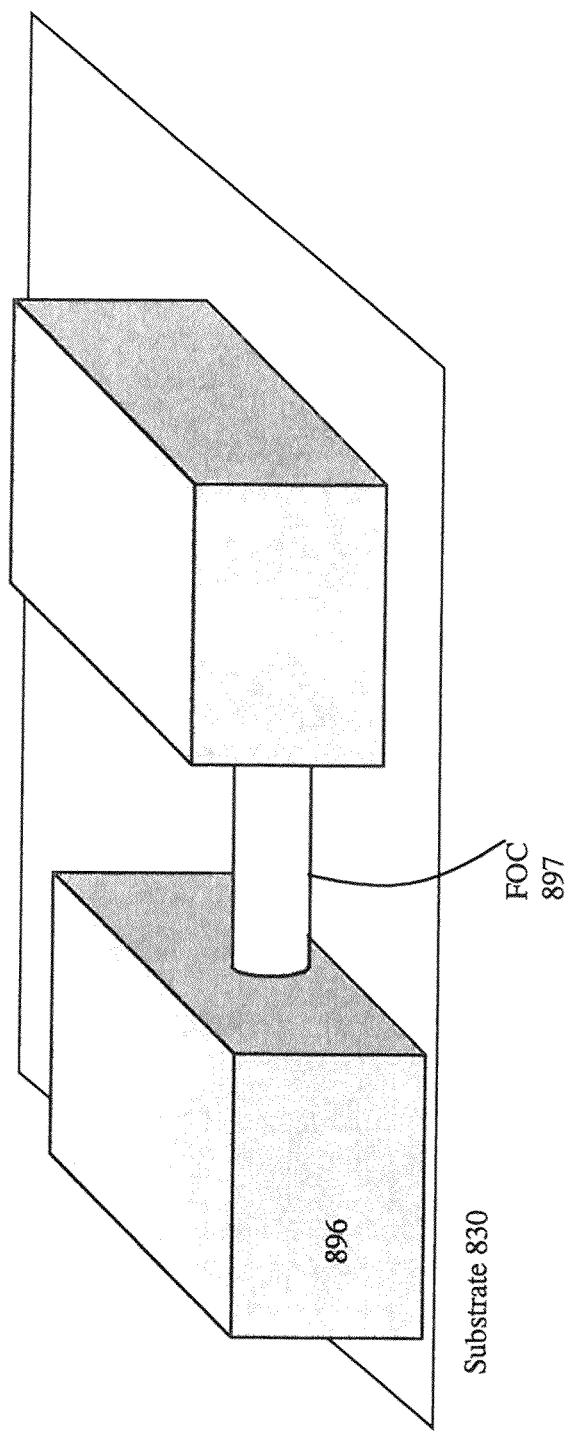
FIG. 8e shows an application of the present invention for fiber optic cable connections according to one embodiment of the invention.

Yet a further photonic connector of the present invention is to grow fiber optic cables 897 to provide for chip-to-chip communications as shown in FIG. 8e. In this embodiment, the fiber optic cable 897 is grown to couple die 896 with die 898. The growing of the fiber optic cable is established using the fabrication technologies as is known in the art.

A further embodiment of the present invention introduces "slugs" as a further interconnect embodiment. While the side mounted rods, balls, and other structures are useful for interconnecting die, another system to effect the interconnect is to use slugs. The slugs are inserts between the die to be interconnected, which in certain circumstances may simplify and make the interconnects more manufacturable. The slugs also may act as interposers, analogous to the way the horizontal interposers are used in the current BGA methods of interconnect, to act as an interface between elements of different thermal expansion coefficients. Thus the slugs represent a different embodiment for interconnection of die.

Slugs come in a variety of shapes and sizes and can be implemented in a number of different manners. In one embodiment the shapes enable the side of the 'client die', the die interface to and which may house the slug, to be cut flush by the wafer cutter such as a saw or laser which is used to ablate the die and/or separate the die from the wafer. Other embodiments include angled cuts and terraced interfaces. Slugs may have certain properties depending upon their purpose, design, usage, and fabrication. For example, one of the embodiments includes the use of active and/or passive components, such as inductors, capacitors, and coils, used to facilitate non-contact or indirect contact. Other embodiments include direct interconnect contact.

Furthermore, the slugs also permit connection to client die, multiple die, and also to another slug. The slugs can also include vias and interconnects within the slug, which aid in translating as well as connecting between client die and/or another slug. In addition, the slugs can have dimensions which traverse the entire side of one of its client die if desired. In one embodiment (not shown), one face of a given slug may extend across all or parts of two or more client die.

The slugs can also have conducting and/or dielectric layers which overlap such layers above and below the initiating layer. For example, the layers and/or contacts on the slug can be thicker than the layer in the client die or in the slug itself, just as the contacts can be in the client die.

In some implementations the conducting layers can overlap vertically and/or horizontally with similar structures on the client die. A further feature of slugs is that they can be integrated into manufacturing using traditional machinery such as a 'Pick and Place' machine. And, the slugs can include interposer characteristics that can match different thermal expansion coefficients.

Referring to FIG. 9a, a slug 910 is shown suspended above die A 900 and die B 905 before final placement. The portions of the slug 910 which are below the conducting layers could be connected to the client die which are connected to the substrate. The shape of the slug 910 is depicted as having a wedge shape however other shapes are within the scope of the invention such as square, rectangular, terraced, circular and polygonic. Furthermore, for indirect coupling, the slug 910 does not have to be shaped to mate to the die and can be any shape that satisfies the functional coupling characteristics.

FIG. 9a is a vertical slice encompassing one or more conductive contact pads on each of the die and slug elements shown. According to one embodiment the slug 910 does not have to connect directly to the substrate (not shown) although it may be desirable in some situations especially when the slug 910 contains active elements. The indirect coupling between the slug 910 and the die 900, 905 can be an indirect interconnect coupling using photonic, microwave, and millimeter wave devices, and various combinations thereof. Inductive and capacitive coupling are other indirect coupling possibilities and are well known to those skilled in the art.

Depending upon the design of the slug 910, it can be used to couple any conducting layer(s) of one die 900 to any conducting layer(s) of the other, die 905. Furthermore, the slug 910 can include features allowing bus and fanin/fanout capabilities as detailed herein.

FIG. 9b shows the slug 910 directly coupled to the die 900, 905 and with the conducting layers CL1, CL2, $CL_N$ and $CL_{N+1}$ of the two die 900, 905 directly connected via the slug 910. In this embodiment, a connection on conducting layer CL1 on die A 900 to CL1 of die B 905 via the ball 918 on each side of the slug 916 does not have to pass all the way up through all the layers of die A and then down through all the layers of die B 916. For example, there may be more than eighteen intervening conducting layers and dielectric layers to get to a connecting structure on the top of the die A 900 and then go back down through the conducting layers and dielectric layers to get to conducting layer CL1 on the other die A 900. The slug 910 does not have to have all the layers of the die and can just employ a subset of the layers according to the desired requirements. Thus, the thicknesses of the conducting layers and dielectric layers of the slug 910 do not have to match that of the die A 900 and die B 905. The coupling via the ball 918 is just one example of the type of interconnect structures that can be used to provide the direct coupling between the die 900, 905 and the slug 910. Instead of the ball, a bump or other members of the direct connection family described earlier could be used. Connection of die and slug without any intervening structure is also possible.

In certain applications, the larger the angle with respect to the vertical of the slope of both the slug and the client die, the more margin there is in vertical placement and also in the placement of the slug and die themselves by, for example, a pick and place machine. Similarly, the margin for lateral placement can be increased by increasing the lateral dimension of the contacts.

Figure 9C:
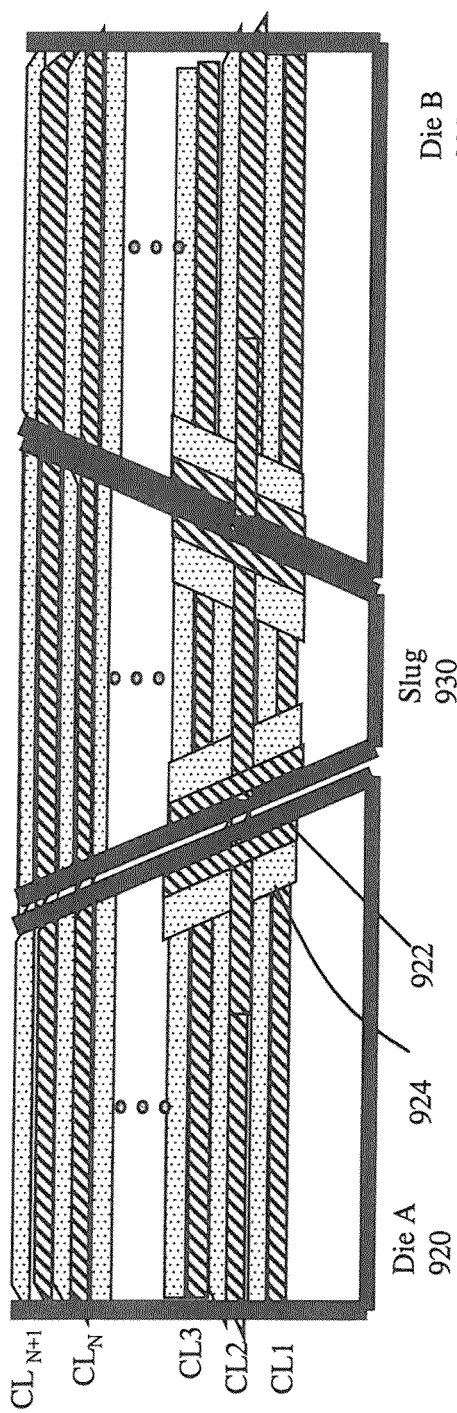
FIG. 9c depicts a further embodiment of the slug allowing multiple layer coupling, configured in accordance with one embodiment of the invention.

FIG. 9c shows how the vertical contact size of conducting layer CL2 in that lateral spot can be enlarged for more margin via the contact flange 922 and to permit easier connection. The lateral size of the contact flange 922 will depend upon many factors. Dielectric layer material 924 surrounds the added 'flange' 922 on the contact to provide isolation for the contact flange 922. In this embodiment, the contact flanges 922 on CL2 on die 920 are coupled to the conducting layers CL1 and CL3 above and below CL2 using the contact flange 922 and further coupled to a contact flange on slug 930, and then to a contact flange on die 925. Over and above simplifying the mechanical connection process, the flange also enables busses, multiple fanouts, and other techniques as described elsewhere.

The contact flange on the die A 920 may fanout to multiple contacts or to a bus on the conducting layer CL1, CL2, CL3 on slug 930 and die B 925 if the latter does not have flanged contacts in that particular vertical slice. Note also that the fanin/fanout can take place in two dimensions, both laterally with a wider contact on die 920, thus giving a wide range of possibilities. Furthermore, the slug 930 can have transverse or diagonal conducting lines in order to couple a conducting line on one die that is at a different height on another die.

Figure 9D:
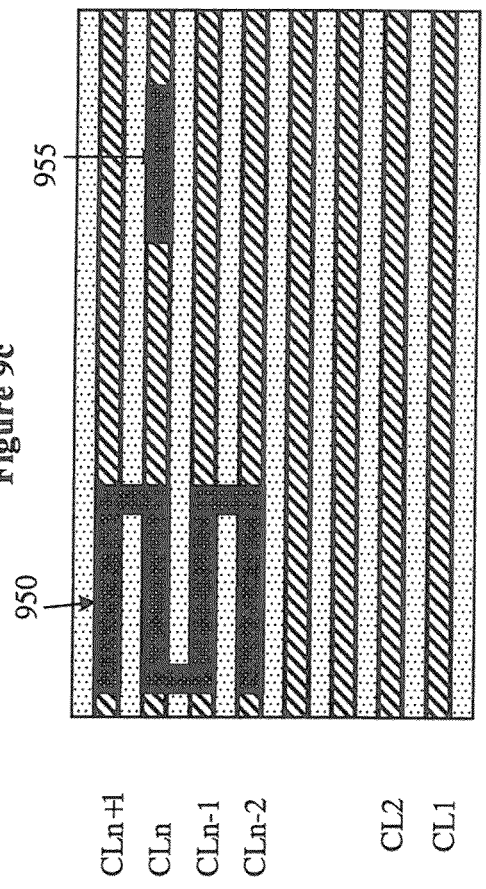
FIG. 9d shows serpentine and non-serpentine inductive interconnects used to couple various layers between die and configured in accordance with one embodiment of the invention.

FIG. 9d shows a serpentine inductor 950 which spans four conducting layers $CL_{N-2}$ to $CL_{N+1}$ and another inductor 955 which resides solely on conducting layer $CL_N$. These could apply to the slanted die and slug surfaces as well as to vertical surfaces such as shown in FIG. 3b and FIG. 3c. Serpentine inductors, spiral inductors and interdigitated structures are well known and described in detail in E. E. Hollis; "Design of VLSI Gate Array ICs", incorporated by reference herein and all within the scope of the invention. The serpentine and interdigitated structures provide high width over length which is a measure of drive capability for a given feature size and technology. However, similar structures can be used to provide inductors without, of course the sources and drains used in the transistors.

The serpentine and interdigitated inductors have ultra-small dimensions to couple the layers in the die to couple. Some of the benefits include being able to fanin/fanout to more than one layer if desired by the simple expedient of connecting or not connecting traces to/from a given layer. The serpentine and interdigitated inductors achieve a large amount of coupling area in a small form factor as opposed to running it all around the die layers. A further benefit of these inductors includes being able to get bidirectional elements by simply having traces on a given layer or on different layers again to connect to one or more parts of the different "legs" of the serpentine.

Figure 9E:
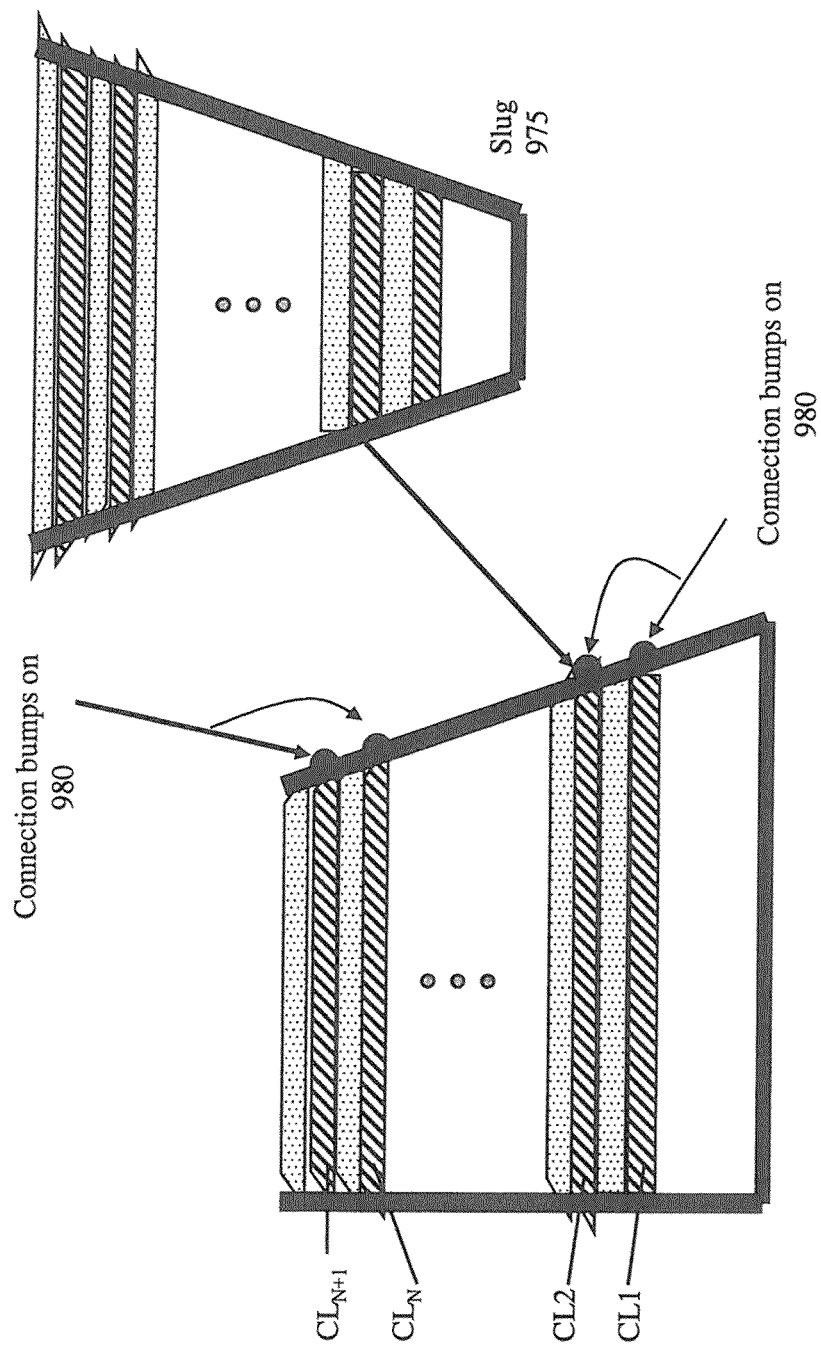
FIG. 9e illustrates one embodiment for coupling the slug onto a die using interconnects, configured in accordance with one embodiment of the invention.

FIG. 9e shows one embodiment for coupling the die 970 to the slug 975. In this embodiment, contact pad bumps 980 on the side edge of the die 970 are coupled to conducting layers CL1 to $CL_{N+1}$, which will then be coupled to slug 975. The bumps 980 could also be tapered rods or other structures that facilitate mating. According to one embodiment the slug can sit directly on the respective die, such as on contact pads, thereby allowing a bare metal to bare metal coupling. The bumps 980 can be formed in a variety of ways including masking as detailed herein. The bumps 980 could also be potentially grown in a manner similar to the liquid cooling pipes are grown or similar to the way in which carbon nanotubes are grown as contacts on the tops of dies. They could also be attached to an interposer or similar thermal spreader and then placed on the side of the die. Depending upon the relative thermal characteristics of the slugs and client die, interposers between slugs and die may or may not be needed. Instead of using interposers between slug and die, it may be preferable to use create metal or carbon nanotube heat pipes or solid rods using vias to route the heat vertically to cold plates on the tops or bottoms of slugs or the die themselves. Heat pipes on the top have already been developed elsewhere.

The formation of the various recessed layers or terraces is yet another feature of the present invention. With this type of slug interconnect, the margin for horizontal placement can be increased by increasing the depth of the terraces. Note that the thin contacts can be supported and strengthened by adjacent dielectric. The recessed conducting layers and dielectric layers of the slug may be less deep than those of the die to prevent the conducting layers from shorting on the conducting layers of an adjacent layer. The ends of the conducting layers may also be spaced with dielectric for the same reason. Any of the previously described elements including but not limited to balls, bumps, rods, bars or carbon nanotubes may be placed on any of the contact pads if needed or desired.

As noted, there are a number of methods for forming the recesses to achieve the terracing. Some of the methods include laser ablation, partial laser singulation, as well as in both mechanical and laser scribing used singularly or in combination. Laser ablation is one technique that occurs when the photonic energy corresponding to the specific wavelength of the laser being used is greater than the bandgap of the materials upon which the laser beam falls. The photonic energy is then absorbed by the material. A number of factors and tradeoffs exist including a very wide variety of lasers and semiconductor materials.

Figure 10A:
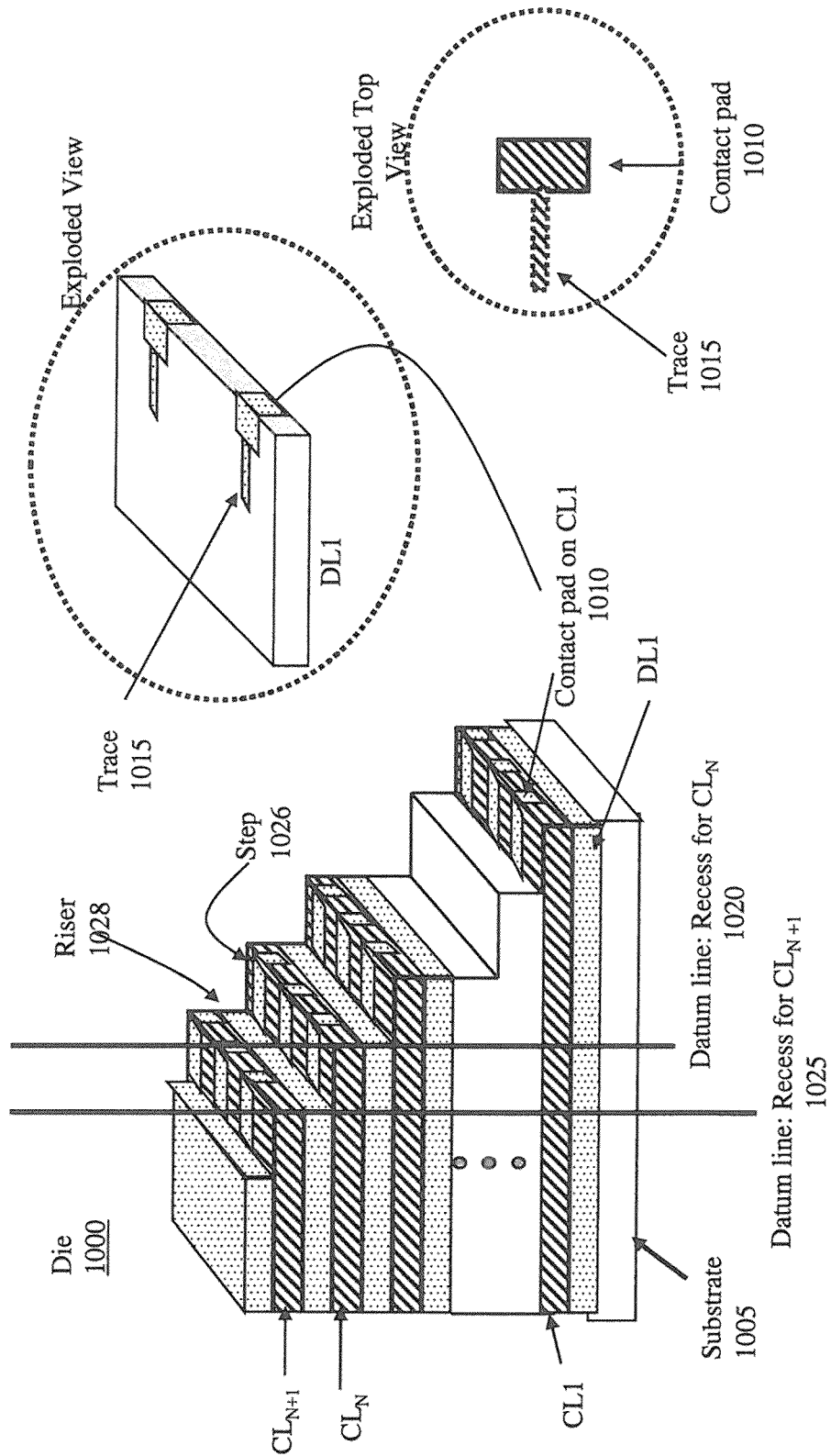
FIG. 10a shows another type of slug interconnect configuration using terraced coupling between the slug and die according to one embodiment of the invention which shows multiple fanin/fanout and how a given signal on one die can connect to another die without having to traverse many layers on the two die.

Referring to FIG. 10a, one embodiment for a three dimensional perspective view of a portion of a terraced die 1000 is shown, illustrating the conducting layers (CL), dielectric layers (DL) and contact points 1010. The substrate 1005 may include a number of other layers as well, as the present invention can be integrated with existing fabrication processes and include any number of layers with or without the sidewards interconnecting described herein. The various dielectric layers and conducting layers are stacked to form the die 1000, wherein the upper layers have a smaller width thereby creating the terracing effect and providing a greater contact layer on the side edge. The datum line for $CL_N$ 1020 and the next respective datum line for $CL_{N+1}$ show the approximate width of the "step" 1026 or width of the extended portion. The "riser" portion 1028 of the terracing is determined by the vertical height of the corresponding conducting and the dielectric layers which, for example, may be 10 microns to 20 microns for 300 millimeter wafers.

In this particular embodiment, the terraced edges of a respective pair of conducting layer and dielectric layer are approximately equivalent and in combination form the riser portion 1026. However, there is no requirement that the conducting layers and dielectric layers be paired together. There is also no requirement that the conducting layers and dielectric layers be the same or similar thickness.

Conducting layer CL1 has been brought out in an exploded view to show the interior view depicting one contact pad 1010 along with its trace 1015 going to/from that pad. It should be readily appreciated that a large number of such contact pads 1010 of different sizes can exist on each side of each of the many conducting, layers. It should also be appreciated that other connecting structures, such as but not limited to balls, bars, and rods can be used in combination with the terraced layers.

As noted in the exploded view of FIG. 10a, the trace 1015 from contact 1010 goes into the conducting layer CL1. It should be readily apparent that it will go to other traces and other circuit elements. As in other figures only the salient parts are shown herein in order to illustrate certain features of the present invention. The mating surfaces on the slug or die may be the same size for fanin/fanout of one or of different sizes for multiple fanin/fanouts and for busses or other uses.

Those skilled in the art will readily appreciate that the terracing of the die and the fabrication of the slug can be accomplished in many different manners. According to one embodiment, the conducting layers are layers of metal, such as aluminum, copper, and/or refractory metals. According to one embodiment, the processing puts down a layer of metal and then etches it away. In another embodiment, using the present technology implementing submicron feature sizes, variants of a 'Damascene' process can be utilized wherein a dielectric layer is etched away and filled with metal(s). The manner of fabrication does not affect the functionality of the invention.

The slug typically need not have all of the conducting layers and dielectric layers of the die with which it is coupled and can be designed to have only those conducting layers according to design criteria. According to one embodiment, the mating contact pads on the slug are just the inverse of those on the client die. Other variations include the use of multiple fanin/fanouts or bus connections. Various permutations are within the scope of the present invention.

As noted herein, one of the disadvantages with the present state of the art using BGAs is the lack of adequate fanout and/or fanin capability greater than one. Similar disadvantages are present with respect to driving and being driven to/from busses of various types. A variety of techniques are described herein using rods, balls, and other structures in addition to integrating photonic and microwave/millimeter wave devices that permit fanouts/fanins greater than one and for dealing with busses. Slugs also can be designed with multiple fanin and/or fanout capabilities as well as multiple bus couplings.

According to one embodiment of the present invention, the lateral dimension of the exposed conducting layers of the die and slugs is significantly larger than the access to such layers in the state of the art. For example, typical current die sizes are in the 500 to 600 mil range or greater. A very large contact to a single fanin/fanout would take up less than 2 mils. Thus, a spacing of the fanin/fanout equal to that single contact size means that a fanin/fanout of approximately 250 to 300 can be attained, wherein typical fanin/fanouts are less than 10. This example is only intended to show that a very large number of fanin/fanout device contacts can be placed on a single conducting layer and is not intended as prescribing any range or limitation. For example, large fanins are used in CPLDs and also in CPUs which use VLIW (Very Long Instruction Words) of 128 bit busses.

In certain embodiments, the recessed conducting layers and dielectric layers of the slug may be less deep than those of the die to prevent the conducting layers from shorting or otherwise interfering with the conducting layers of adjacent layers. The ends of the conducting layers may also be spaced with dielectric portions.

Figure 10B:
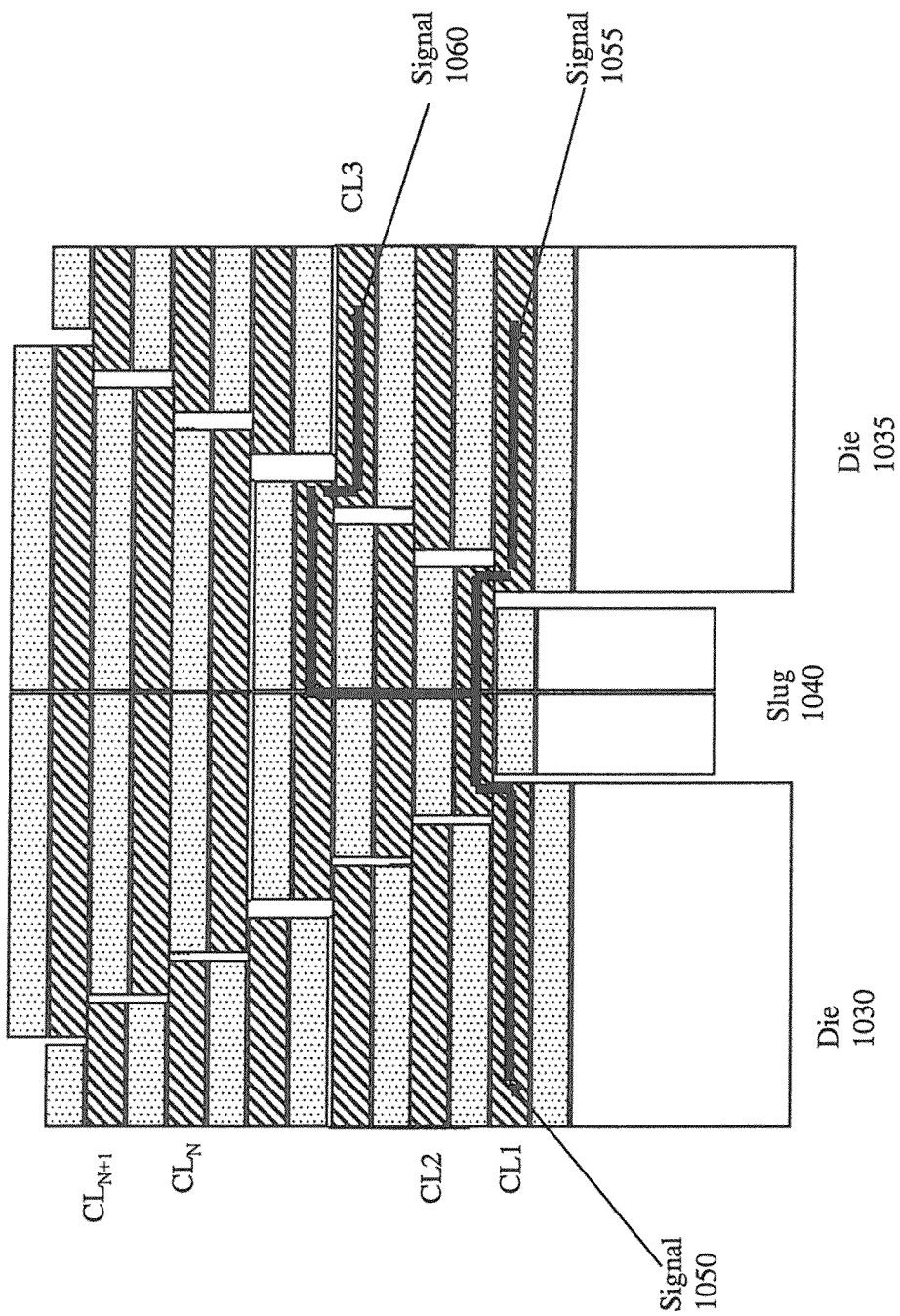
FIG. 10b is a further illustration of the terraced coupling between the slug and die according to one embodiment of the invention.

Referring to FIG. 10b shows a vertical slice of layers of slug 1040 making contact with the opposing contacts on a similar vertical slice in die 1030 and coupling to die 1035. There are a variety of ways to effect the connection of the slug 1040 with its client dies 1030, 1035. One common system for a 'pick and place' machine is to place both dies 1030 and 1035 and then place slug 1040 to mate with them. According to one embodiment a conducting layer on one die 1030 can be routed through the slug 1040 and couple to some other conducting layer on another die 1035. While the layers are shown to be approximately planar, there is not requirement that the die conducting layers be about the same horizontal plane as the slug can shift the elevation and transfer to another height on the other die. This is in addition to the various fanin/fanout capabilities described herein.

In a further embodiment, a signal 1050 on conducting layer CL1 of die 1030 traverses through slug 1040 to signal 1055 on the conducting layer CL1 on die 1035. It should be noted that the signal path to get from die 1030 to die 1035 using slug 1040 is much shorter than if the signal had had to traverse all the way to the top of die 1030 and then through the various layers of the other die 1035 all the way back down that to get to conducting layer CL1 on die 1035.

In yet a further embodiment, showing one example of fanning out inside slug 1040, the signal 1050 from die 1030 is routed not only as signal 1055 via the conducting layer CL1 of die 1035 but also as signal 1060 via a path inside the slug and to conducting layer CL3.

It is also within the scope of the invention to include certain signal processing or conditioning functions within the slug in addition to the signal routing functions. Yet a further embodiment is the use of programmable interconnects which could be either mask programmable or field programmable to connect signals.

Figure 10C:
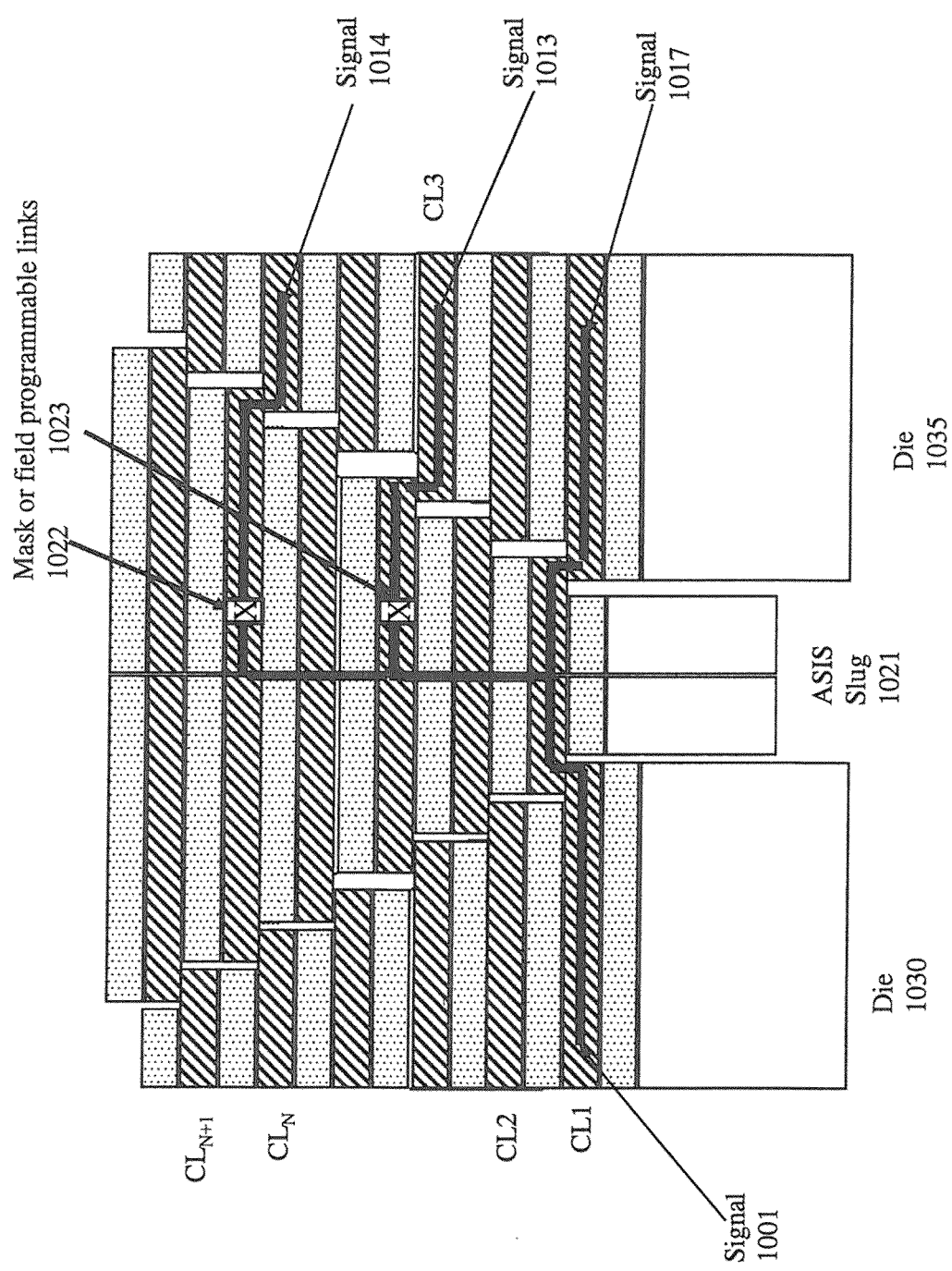
FIG. 10c shows field or mask programmable slugs used to connect signals from one die to another die.

FIG. 10c is similar to FIG. 10b except that Application Specific Slug (ASIS) 1021 has programmable interconnects 1022 and 1023 which could be either mask or field programmable to connect signal 1001 to signals 1013 and/or 1014 as well as to 1017.

FIG. 10d shows yet a further variation of the slug providing a coupling between die using an active element slug which has one or more active elements built into it. In this embodiment, a signal 1082 on the conducting layer CL1 on a first die 1070 is coupled to a transmitter device 1086 that transmits a signal 1084 to a detector element 1087 on conducting layer CL1 of another die 1075. The transmitter device can be, for example, various types of photonic transmitters and transceivers such as an Edge Emitting Laser, while the detector 1087 can be an integrated photodetector such as a PIN device. The transmitter 1086 can transmit a signal 1084 to any of the conducting layers or multiple conducting layers on the other die 1075. Furthermore, it is within the scope of the present invention that the transmitter 1086 broadcasts the signal 1084 perhaps but not limited to digital spread spectrum signals to the detector 1087. If the signal being broadcast is a digital spread spectrum or similar, then multiple signals from multiple transmitters can exist simultaneously, and is within the scope of the invention. Microwave or millimeter wave transmitters could also be on the active element slug with corresponding detectors on die 1075. Again, the correlation gain of direct sequence digital spread spectrum and similar techniques may be employed.

Figure 10E:
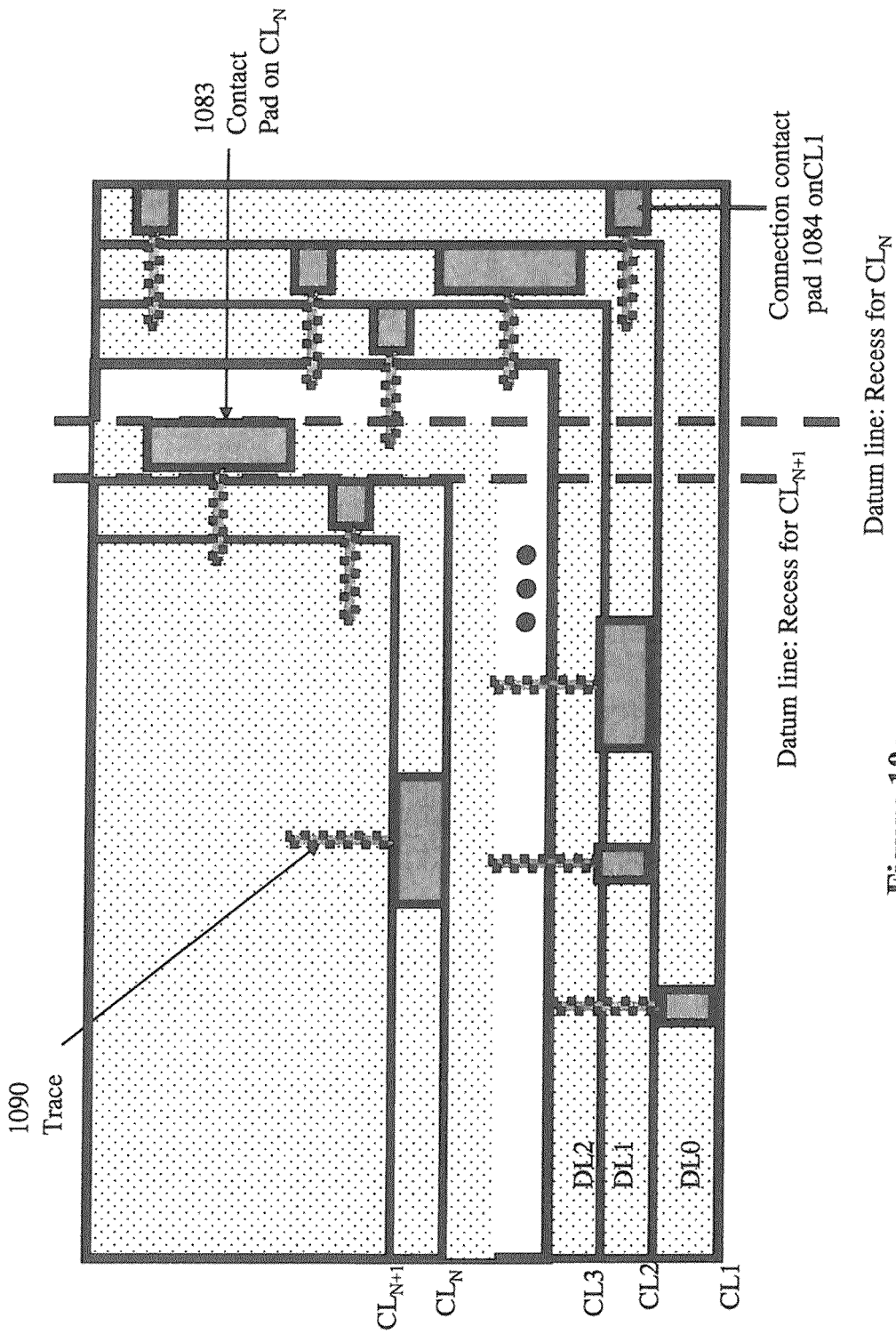
FIG. 10e shows a cut-away perspective view of the various layers and the contact pads coupling therein according to one embodiment of the invention.

FIG. 10e is a simplified version of one of several masks that would be used in one embodiment to fabricate the terraces. Those skilled in the art will recognize the contacts 1083 and 1084 embedded in various dielectric layers as discussed herein. Note that none of the masks required to form the terraces is unique or special to forming the terraces. Standard techniques and standardized equipment can be used.

An active element slug does not have to have its active elements on the bottom. This configuration will simplify and minimize the interconnects in many cases. This configuration is in effect a die turned upside down.

One of the embodiments provides the ability to interconnect die of different thicknesses to enable technologies which are optimum for a given function to be used, mixed, and interconnected in the same package. For example, HBTs are generally the technology of choice for A/D converters, low phase noise amplifiers, and photonic elements such as Edge Emitting Lasers. On the other hand Si CMOS is generally the technology and structure of choice for most other applications because of low cost.

The dies may be of different thicknesses due to differences in numbers of layers and starting wafer thicknesses as well as different shapes. The present invention thus allows for a source, such as a photonic, microwave or millimeter source, in one die to radiate to one or more layers in one or more die with a relatively broad beam. The beamwidth typically depends on the combination of frequency, aperture size, and antenna type. Note that photonic, microwave, and millimeter signals can all be present simultaneously because of the very different wavelengths. Moreover, using techniques such as digital spread spectrum, different codes, different frequencies, and multiple sources of each type can be present simultaneously.

Figure 11:
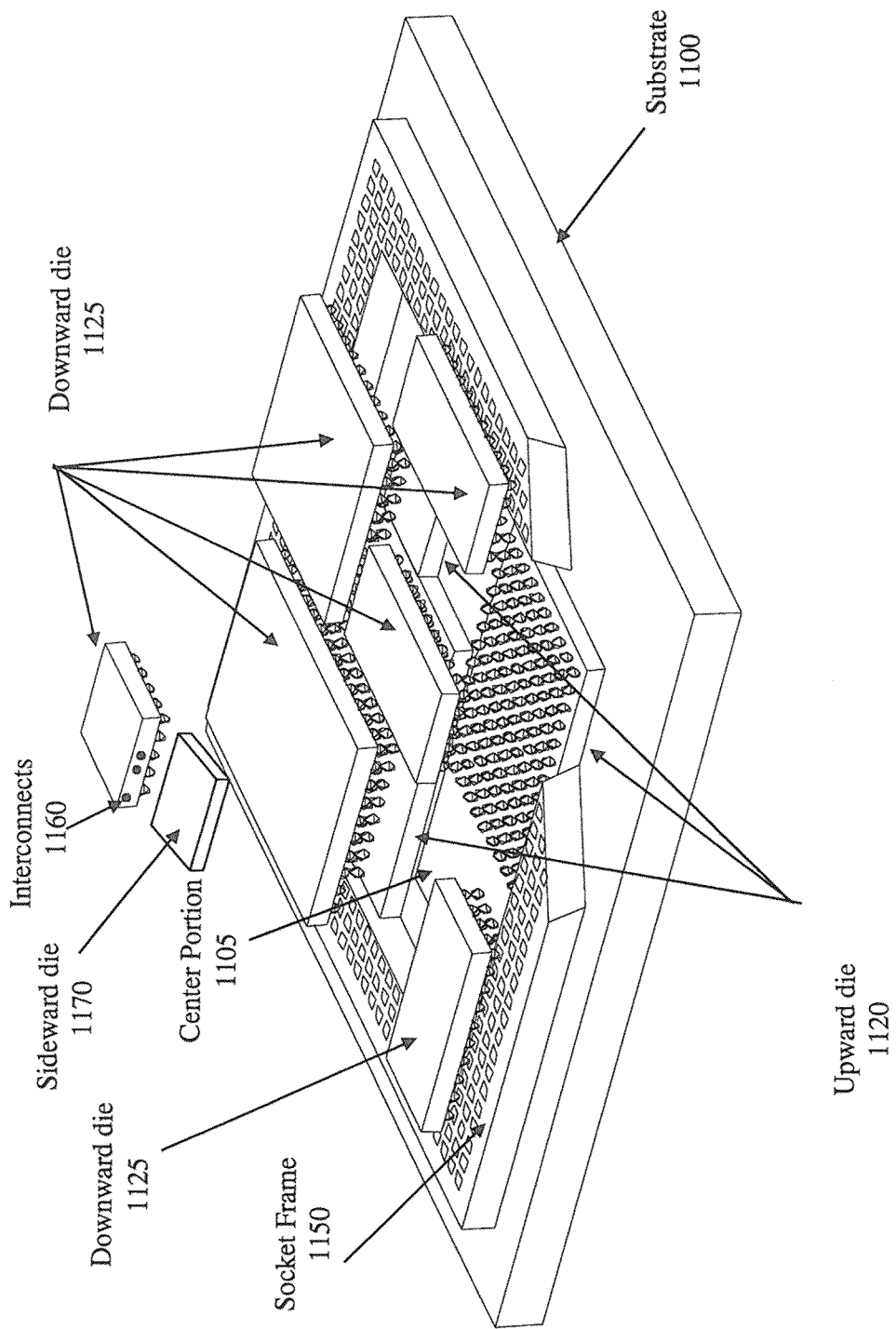
FIG. 11 is a top perspective view of a board having a substrate with multiple die of various sizes and illustrates the sidewards interconnect according to one embodiment of the present invention.

Referring to FIG. 11, one embodiment illustrating multiple chips deployed on a substrate is shown for illustrative purposes. A socket frame 1150 is coupled to a substrate 1100, wherein a center portion 1105 of the substrate has some upward die 1120 coupled to the substrate with interconnects on the top surface of the upward die for coupling to downward facing die 1125. The sizes and shapes of the die can vary and multiple die couplings are shown. The downward die can couple directly to the socket frame 1150 or to the contacts on the upward die 1120. Also included is a sideward die 1170 that couples to one of the downward die 1125 via certain interconnects 1160. In this embodiment, the sideward die 1170 can couple to the downward die 1125 and may also couple to the socket or an upward die 1120. While this particular embodiment shows a die to die coupling via an interconnect 1160 such as a rod or ball, the use of slugs is also within the scope of the invention.

For illustrative purposes, suppose that for a given die there are 500 to 600 Edge Emitting Lasers located on all four sides of the die and operating on different wavelengths and/or using different digital spread spectrum or other coding to prevent interference with each other. Alternatively one or more Edge Emitting Lasers could be addressing a number of photodetectors on other including broadcasting to multiple die.

According to another embodiment, a number of slug predefined configurations that can be manufactured in large quantities analogous to current mask programmable and to the field programmable technologies.

The depth of some packages exceeds the thickness of a die by factors of two to twenty or more. However, by turning the slug on its side, the length of the slug now corresponds to the side edge of the package. Several layers of package terraces can be used with a terraced slug. For example, if the recess of each package terrace is 2 mils and the minimum die/wafer thickness is 4 mils then multiple terrace levels can be accommodated.

Major benefits of using terraced slugs to interface to a terraced package include savings of at least forty to fifty mils on each side which is very significant in high density packages. Another advantage is the elimination of the need to wire bond each pad. A further feature is the elimination of the inductance and capacitance associated with the wire bond which in turn means much faster operation. In addition, the present invention provides much better heat conductivity which continues to be a factor with higher speeds and smaller form factors.

The interconnects of the present invention have numerous applications including as a Mach-Zender phase shifter which is a typical element that could be used to code and decode a photonic signal. Typical digital spread spectrum direct sequence codes are improved or enhanced by implementing certain embodiments of the present invention.

Another variation includes having the die inverted wherein the substrate and active elements are on the top and is broadcasting to at least one other die. The slug can be designed to include any number of variations that are all within the scope of the invention.

There are a plethora of available techniques for the interconnect on one or more of the four sides of a given die. There can be any numbers of recesses up to the maximum number of conducting layers for the layers as not all conducting layers on a given side may be recessed and equipped with contact pads. There can be any number of contact pads on the different conducting layers up to the maximum permitted by the dimensions of the die, slug, and contacts. Furthermore, different types of slug contacts, for example, one or more sides could be terraced while other sides have different contacts while other sides might have no contacts at all. In addition, the interconnects may involve any combination involving balls, bumps, rods, and bars on the side and/or top.

As known to those skilled in the art, there are many types of masks and masking methods including but not limited to positive, negative, phase shift, multi-tiered, x-ray, and e-beam.

The mask area represents an area that blocks deposition of material. An open area indicates a hole that may be filled, generally with conducting material. The term conducting layer is intended to include but is not limited to one or more of the permutations of the Damascene method of inlay which is probably the most widely used method in state-of-the-art facilities. The term also includes the older method of putting down a conducting layer and then etching it. In one embodiment, the recesses are formed in each successive set of conducting layer and dielectric layer by masking out the lower layers so that no conducting or dielectric material is deposited.

The present invention has numerous applications and is applicable across a number of different fields. One application relates to Edge Emitting Lasers (EELs) and Vertical Cavity Surface Emitting Lasers (VCSELs) and the typical beam dimensions. Note each such device occupies only a very small portion of a die edge, for example, 100 to 200 microns or 4 to 8 mils, equal to the size of just a single bonding pad or a further size that includes the space between it and the next pad. By way of illustration of one example, approximately 75 such devices can be implemented on each edge of a die with a 600 mil edge, and the depth is similarly infinitesimal.

Another application of the present invention relates to techniques for generating Photonic Digital Spread Spectrum Signals as is known in the art. By way of illustration, a Mach-Zender phase shifter can be used to generate the phase coded signals. The ultra-small size of the Mach-Zender photonic phase shifter permits many of them to be used in applications for photonic digital spread spectrum without taking up significant space.

The present invention also is applicable to microwave technologies. For example, Radio Frequency Identification Devices (RFIDs) long ago proved that ultra-small antennas could be mounted on chips that contain additional circuitry. As is well known the chips are used in applications as diverse as credit cards and are embedded in animals, humans, and truck tires. Such devices benefit from the interconnect technology detailed herein and is within the scope of the invention.

The ability to communicate with other chips within the package has many benefits. The present invention provides sufficient isolation wherein such chips are used inside packages to send and receive information between and among other chips within the package and perhaps outside the package. To keep signals from interfering with each other within a given package and perhaps even off and on the same chip, techniques such as digital spread spectrum, orthogonal frequency division multiplexing, etc. can be used as noted herein.

As noted, one of the applications described herein includes implementing the sidewards coupling for some of the circuit elements used at the macro level for digital spread spectrum. Another aspect includes the integration of the coupling technology with the generation of a phase coded pulse with a tapped delay line. A further application relates to the non-delay line methods for generating phase coded signals.

Although RFIDs have established ultra-small components and techniques made on chips, improvements in higher frequencies are always in demand. As frequencies increase, the resistance also increases for a given conductor and size, because the skin depth decreases roughly as the inverse square of the frequency. This in turn decreases the conductivity and increases the resistance of the traces, creating an undesirable situation given that noise margins have significantly also dropped due to lowered switching thresholds. This again points to the needs delineated elsewhere to minimize path lengths as much as possible, a problem addressed by this invention.

Higher dielectric constant materials for transistor gates are now just a few molecules thick with attendant high leakages. The push toward higher and higher frequencies is aided and abetted by a corresponding push for higher and higher dielectric materials. The present invention anticipates further advances in the fabrication and manufacturing technologies such as higher k materials. Such technological improvements provide many benefits such as putting waveguides of different types in the chip itself at the higher frequencies. By way of further example, if the garnets YIG AND YAG and which have k values of 16 and 14 respectively were used, the size of a waveguide would decrease by a factor of 4. The length of tapped delay lines would decrease by the same amount as would the length of ¼ and ½ lambda wavelength stubs. With k factors of 100, the decreases would be a factor of 10.

In particular but without limiting the scope of the invention the present invention allows for a new schema for multiple fanin/fanout and bus access capabilities via the sidewards interconnects. The number of available inputs/outputs is greatly increased facilitating the number and types of signal communications. Some of the benefits of the present invention accomplished by the sidewards coupling as opposed to traversing vertically through numerous layers is increased speed, decreased power and enhanced noise margins. Other advantages include simplification of distribution of clock signals, and set/reset signals, including the test capabilities of using in-situ monitoring of selected signals.

The present invention permits direct and indirect interconnect, coupling and monitoring using photonic, microwave, and millimeter wave devices, and various combinations thereof. One of the advantages of the present invention includes the increased number of inputs/outputs. The terraced die with conducting layer $CL_{N+1}$ brought out to one side to provide access to the contact pads. Typical pad widths currently used are 2 mil with a 2 mil spacing although these dimensions will decrease as technology improves.

For a typical 600 mil on a side die, this means that on the order of 150 such pads can be made per side per conducting layer or about perhaps 600 per conducting layer. Eight conducting layers allow roughly 4800 inputs/outputs per die compared to the current 1800 to 2000 currently available with conventional BGA and roughly 400 to perhaps 600 with conventional wire bonding. Larger numbers of conducting layers and or smaller contact pad sizes will increase this even further.

There are significant advantages to the sidewards coupling and decreased line lengths. It is well known that transistor switching times have decreased so much that propagation delays and connectivity often far outweigh them. As stated previously, traversing many layers of interconnect with the attendant numbers of vias and increased path lengths has several drawbacks compared to the present invention. Longer path lengths slow the circuit down not just because of the longer path lengths but also because of the parasitic capacitances of the highly dense signal traces. Moreover, as the line widths decrease, the number of "squares" increases for a given length of line which in turn increases the amount of resistance for a given length of line. Exacerbating these problems is that the effective thickness decreases as operating frequencies increase due to skin depth decreases which further increases the resistance of a square with a concomitant increase in line resistance.

This also increases the resistance of a given square making it more difficult to design clock set/reset trees and other busses whose elements must track and whose skews must be minimized. The increased path lengths also use more power because of the higher overall resistance of the line have greater voltage drops which significantly impair noise margins especially in the era of large chip sizes and low voltages. It is well known that the clock on a chip takes up considerable chip area and uses considerable power. Often not realized are the problems of dealing with slave clock skews and concomitant setup/hold and slack time issues. All of these problems are significantly exacerbated by the inability to connect directly from the conducting layer of one die to that of another die. Many chips have phase locked loops (PLLs) to synchronize the incoming data which place additional restrictions and which are impacted by the aforementioned delays and fanout restrictions of the current art.

A further benefit of the above scheme is that it allows newer non-contact probe sensing methods to examine the signals on the chip in-situ and while the chip is operating. For example testing outputs from any of the scan methods such as LSSD (Level Sensitive Scan Design) can be sent to on chip photonic, microwave, and/or millimeter wave devices for transmittal to outside contacts as described herein.

There are currently several ways of separating individual die from wafers. The most common methods are by scribing and dicing as known to those skilled in the art. The depth of the cut of current dicing saws can be controlled to a precision of one micron. However, it should be readily apparent that the present invention is not restricted to such wafer technology.

Several different methods of interconnecting signals to/from the side of one die to/from the sides of adjacent dies are provided herein. The resulting combinations are mounted on substrates and/or in packages using standard techniques.

It is well known that a significant portion of the power dissipated by a die is removed via the contacts. A majority of the heat is generated by the active elements such as transistors and diodes. The conducting layers are above the layers containing the active elements. As the number of conducting layers has sharply increased, the heat generating mechanisms are buried further and further away from the means to get rid of the heat.

As the side connections of the present invention have much lower resistance, capacitance and inductance per square, they are useful for interconnections on any die regardless of whether they go to other die within the package. In one embodiment the side connections are used to route a signal which fans out to several different elements on the die which are widely separated and thus solve routing problems. This can be important in the struggle to route slave clocks and reset signals whose skews and slack times must track each other and be minimized.

As detailed herein, it should be readily apparent that "hard" wired (direct connection), "soft" wired (capacitive and/or inductive coupling) and/or the use of conductive elastomers and wireless techniques all have value in interconnecting multiple chips in a package. The present invention allows for interconnects using any of these techniques either separately and/or simultaneously.

Wireless techniques, as described herein, includes photonic communications, microwave communications, millimeter wave combinations or a combination thereof wherein the indirect coupling can also be achieved by capacitive and/or inductive coupling at short ranges among the chips in the package, especially those in apposition to one another. Within these wireless categories are various communication methodologies as known to those skilled in the art.

By way of illustration, one particular type of digital spread spectrum is described herein for exemplary purposes, however it should be readily apparent that many other types are possible and all are within the scope of the present invention. The present invention does not require or apply to just one specific technology, methodology, or structure.

Note that photonic, microwave, millimeter wave signals can all be present simultaneously because of the different wavelengths and/or coding. Moreover, using digital spread spectrum technique, different codes and/or different frequencies from multiple sources of each type can be present simultaneously.

A further application includes memory and stacked multi-chip memory packages. Speed and latency are two very major concerns of not just memories but also many other types of chips. For example, it is within the scope of the invention to have special ultra-thin die 40 micron thick which are separated and supported by 40 micron thick interposers with an additional 40 micron allocated to wire loop for bonding.

The term "wireless" has come to imply a digital bit stream that is superposed on a microwave or photonic carrier which is then removed to be decoded in a non-co-located receiver. In the context herein in which the communication is among chips separated by almost infinitesimal distances, it may or may not be necessary to convert to and from microwave frequencies although such conversions are within the scope of the invention. Instead the digital bit stream may be transmitted directly across the infinitesimal distances among chips.

There is a benefit to higher speed communications because the higher operating frequencies enable structures such as various, smaller antennas, and various types of waveguides using modes other than the TE10 modes. Normally useless evanescent modes may have benefit in this application. Systems running at 40 GHz are currently available and likely to increase. When communication is desired with chips in the same package that are not adjacent to each other or for other reasons, the signal may be superposed on a microwave or photonic carrier. Communications of 40 GHz may utilize standard techniques such as phase locked loops albeit at higher frequencies than that at which they are commonly used.

When communication is desired among chips that are not adjacent to each other in the package and sometimes with those that are adjacent to one another, it may be desirable to use a wireless technique to enable such communication.

Such a method should also enable many such communications among the different chips in the package to take place simultaneously and without interfering with one another and without the need for direct contact when the proper wireless techniques are usable.

Digital spread spectrum techniques as well as other methods as detailed herein can be used for such communications. They also have considerable value when the direct contacts in this invention are used among chips in that they mitigate the undesirable cross-coupling of signals on the chip at superhigh frequencies of operation which in turn force the greater spacing among chip lines.

The digital spread spectrum and similar techniques can enable the communication infrastructure. Digital spread spectrum is thus a means of enabling the pieces of multiple signals to occupy parts of the same spectrum without interfering with one another. Digital spread spectrum is well-known and numerous digital spread spectrum codes have been developed as is known in the art.

Originally there were two generic types of digital spread spectrum, namely frequency hopping and direct sequence. A newer technique is Orthogonal Frequency Division Multiplexing called Orthogonal Wavelength Division Multiplexing when photonics are used.

In direct sequence digital spread applications, the phase of the signal is changed by 180 degrees if the signal is a "one" or not changed if the signal is a "zero." Opposite coding as well as other phases, e.g., 90 or even 45 or 22.5 degrees have also been used. The signal can also be coded photonically. If inner and outer codes are used, the inner code is called the "bit" or more commonly the "chip." The power density in any piece of the spectrum of a given direct sequence signal is typically very low. The correlation gain of the direct sequence signal is achieved by reassembling the pieces according to the code that was employed.

As noted although the current invention does not require the use of digital spread spectrum or the sequences however the packaging techniques described herein are a significant enhancement to the direct sequence applications.

Automated layout tools such as silicon compilers have been available from a number of major vendors for a number of years and are generally part of standard layout packages. These tools enable the form factor, pitch and aspect ratio, of a given die or portion of a die to be readily changed. As the number of pins in IC's increase and with the need to keep these packages small, the spacing between package pins decreases. Since these arrays can have hundreds of pins on each side and because IC design rules have minimum trace widths and clearances, many IC signal layers are required to be able to interconnect to the pins of the package. IC designers assure compliance with Design Rules with software tools that has rules for clearances between various object pairings, and conformity of a given layout. The software tools confirm that a given pattern complies with any requirement, criterion, or preference articulated.

As noted herein, one of the many advantages of the present invention is the ability to interconnect die of radically different thicknesses and therefore enable technologies which are optimum for a given function to be used, mixed, and interconnected in the same package. For example, HBTs are generally the technology of choice for analog-to-digital (A/D) converters, low phase noise amplifiers, and photonic elements such as Edge Emitting Lasers. On the other hand Si CMOS is generally the technology and structure of choice for most other applications because of low cost.

In addition, there are a number of related designer issues that require detailed knowledge and forethought. For example, the designers generally establish design plans for the chip "real estate" and layout. They also consider how to avoid losing the gains obtained on the chip in the package when the signals go to the outside world which has capacitances and inductances which are orders of magnitude greater than those within the chip or within multiple dies connected to each other within a given package. The designers also contemplate how to obtain as much functionality as possible among elements that are symbiotic, for example different in some respects (e.g.: analog, digital, microwave, or photonic) but complementary in other aspects. These designers also deal with the gate-to-pin ratio and the larger and larger numbers of I/O. Further designer considerations include how to realistically model and simulate the interconnects that travel circuitous paths, such as from the bottom of the conducting layer stack to the top. Even further considerations include wired functions (e.g.: NAND, NOR, AND, and OR) along the paths that can go up to a given layer and then reverse and come part way back down to pick up another wired function as allowed by the structure and technology, including CMOS and differential cascode, Source Coupled FET Logic (SCFL), and Emitter Coupled Logic (ECL).

As noted herein, the industry is pushing for higher speeds and smaller packaging, including die packaging. The industry continues to evolve and there is an increasing push to merge and integrate symbiotic structures, including ADCs, DACs, analog, and digital microwave/millimeter wave, and photonic devices including Edge Emitting Lasers on a single chip. The increased use of HBTs made from different materials such as SiGe, GaAs/AlGaAs, InP, SiC, and SiN, and the newer InSb has certain distinct advantages which enables this merging.

A major benefit of the HBT is the transconductance, a measure of the ability to drive loads both on and off-chip, which is one to three orders of magnitude greater than that of a FET device including the common CMOS structures. The increased usage of custom designs configured to a specific function, for example Fast Fourier Transforms (FFT) and Analog-to-Digital Converters (ADC), and characterized as commodities, continue to mitigate the expense and chip development. There has been a growing tendency of some manufacturers to use smaller specialized chips with one or more functions which must be integrated with other chips. Generally this occurs when the number, type, and speed of pinouts and other parameters are not dominant issues. A number of central processing, units now carry 'on-chip' wireless communication capabilities to facilitate such communications. One of the reasons for the development of such chips comes from a number of trends such as the 'point and click' nature of the internet and the instantaneous nature of voice and graphics communications.

There have also been some recent developments and trends related to the increasing use of digital spread spectrum and analog spread spectrum techniques in consumer applications. The development of materials with high dielectric constants is used to increase the number and variety of short range communication techniques in small packages. There are also emerging areas for some methods for ultra-short range coupling such as on a die.

As noted herein, the present invention can be integrated with carbon nanotubes and have features sizes as low as one one-hundredth of that of current semi-conductors with extremely high electrical conductivities, thermal conductivities twice that of diamond which has the highest of all conventional materials, and the capability of being grown at predefined sites on silicon wafers. Micro Electro-mechanical Machines (MEMS) is another area that will pioneer new systems and devices in many areas. Single nanocrystal technology and the development of silicon lasers using single silicon nanocrystal technology is another area that can employ the technology. Heretofore injection, i.e., semi-conductor lasers had to be fabricated using double heterojunction bipolar transistors (HBTs) which is a more difficult process. Quasicrystalline structures may enable communication systems to be powered by photons instead of electricity and enables light to make sharp turns as it travels through photonic circuits unlike current photonic circuits. These new developments may significantly increase the speeds of communications and computing devices. Furthermore, faster and more accurate "steering" to a specific address on another chip in the package or even to a different part of the same chip must be achieved.

The crowding of the radio spectrum and the increasing value of using photonics for both processing and interconnect has also highlighted certain limitations of the current state of the art. The movement to higher and higher frequencies is a problem on the chip because it forces a minimum spacing between parallel adjacent lines and/or a maximum operating frequency. It is also a problem because as frequency increases, the skin depth decreases which means that long runs that traverse many conduction and attendant dielectric layers will have higher resistance especially when the resistance of the stepped vias is taken into account.

The present invention includes numerous novel embodiments, such as communicating within a package using active elements and wireless techniques including photonic devices, microwave, millimeter wave, slugs, active element slugs, and programmable slugs, terraced die and slugs, interconnection of die having varied shapes, sizes and thicknesses, inductive coupling for interconnections of die to die and die to slugs.

A number of architectures employing the side mounting of the interconnects are within the scope of the present invention. The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An interconnect system for coupling between die, the interconnect system comprising:
    a first die including a plurality of first die conducting layers and a plurality of first die dielectric layers;
    a second die including a plurality of second die conducting layers and a plurality of second die dielectric layers; and
    a slug disposed between the first die and the second die and coupling the first die to the second die, wherein:
        the slug includes a slug conducting layer and a slug dielectric layer,
        the slug conducting layer is coupled on a first end to at least one of the plurality of first die conducting layers on a side of the first die,
        and a second end of the slug conducting layer is coupled to at least one of the plurality of second die conducting layers on a side of the second die.

2. The interconnect system of claim 1, wherein at least one of the first die or the second die comprises an angled die edge, and wherein the slug further comprises a corresponding angled slug edge.

3. The interconnect system of claim 1, wherein the slug comprises at least one of dogleg cuts, grooves, notches, contacts, tapered side edges, or terracing.

4. The interconnect system of claim 1, further comprising an interconnect including at least one of a rod, a ball, dual balls, a bar, a cylinder, a bump, conductive contact pads, or a carbon nanotube.

5. The interconnect system of claim 1, further comprising an interconnect including at least one of an inductive interconnect, a capacitive interconnect, or a wireless interconnect.

6. The interconnect system of claim 1, wherein the slug further comprises at least one programmable link.

7. A slug comprising:
    a top surface;
    a bottom surface smaller than the top surface;
    a first lateral side between an edge of the top surface and an edge of the bottom surface, wherein the first lateral side is tapered;
    a second lateral side between an edge of the top surface and an edge of the bottom surface;
    a first plurality of contacts on the first lateral side;
    a second plurality of contacts on the second lateral side; and
    a plurality of conducting lines extending between the first plurality of contacts and the second plurality of contacts.

8. The slug of claim 7, wherein one of the first plurality of contacts is electrically connected to at least two of the second plurality of contacts.

9. The slug of claim 7, wherein one of the second plurality of contacts is electrically connected to at least two of the first plurality of contacts.

10. The slug of claim 7, wherein at least one of the first plurality of contacts comprises a flange.

11. The slug of claim 7, wherein at least one of the plurality of conducting lines comprises a mask-programmable link.

12. The slug of claim 7, wherein at least two of the plurality of conducting lines comprises a mask-programmable link.

13. The slug of claim 7, wherein at least one of the plurality of conducting lines is diagonally-oriented.

14. The slug of claim 7, wherein the second lateral side is tapered.

15. A slug comprising:
a top surface;
a bottom surface smaller than the top surface;
a first lateral side between an edge of the top surface and an edge of the bottom surface, wherein the first lateral side is tapered;
a second lateral side between an edge of the top surface and an edge of the bottom surface;
a plurality of terraced layers decreasing in size between the top surface and the bottom surface, wherein the plurality of terraced layers form a plurality of steps on the first lateral side;
a first plurality of contacts on the first lateral side;
a second plurality of contacts on the second lateral side; and
a plurality of conducting lines extending between the first plurality of contacts and the second plurality of contacts.

16. The slug of claim 15, wherein the plurality of terraced layers form a plurality of steps on the second lateral side.

17. The slug of claim 15, wherein at least one of the first plurality of contacts is exposed on a bottom surface of at least one of the plurality of steps on the first lateral side.

18. The slug of claim 15, wherein at least one of the plurality of conducting lines comprises a programmable link.

19. The slug of claim 15, wherein at least one of the plurality of conducting lines is diagonally-oriented.

20. The slug of claim 15, wherein one of the first plurality of contacts is electrically connected to at least two of the second plurality of contacts.

\* \* \* \* \*

UNITED STATES PATENT AND TRADEMARK OFFICE
CERTIFICATE OF CORRECTION

| | |
|---|---|
| PATENT NO. | : 8,426,968 B2 |
| APPLICATION NO. | : 13/169384 |
| DATED | : April 23, 2013 |
| INVENTOR(S) | : Hollis |

It is certified that error appears in the above-identified patent and that said Letters Patent is hereby corrected as shown below:

In the Drawings

In Fig. 5, Sheet 8 of 25, delete " $CL_N$ " and insert -- $CL_N$ --, therefor.

In Fig. 6b, Sheet 9 of 25, delete "Opening 656" and insert -- Opening 660 --, therefor.

In Fig. 6d, Sheet 10 of 25, delete "658" and insert -- 662 --, therefor.

In Fig. 9d, Sheet 18 of 25, delete " $CL_{n+1}$, $CL_n$, $CL_{n-1}$, $CL_{n-2}$ " and insert -- $CL_{N+1}$, $CL_N$, $CL_{N-1}$, $CL_{N-2}$ --, therefor.

In Fig. 10e, Sheet 24 of 25, delete "pad 1084 onCL1" and insert -- pad 1084 on CL1 --, therefor.

In the Specification

In Column 1, Line 31, delete "Marketplace." and insert -- marketplace. --, therefor.

In Column 6, Line 43, delete "second," and insert -- second --, therefor.

In Column 7, Line 33, delete "FIG. 1d a" and insert -- FIG. 1d is a --, therefor.

In Column 7, Line 56, delete "FIGS. 6a-e shows" and insert -- FIGS. 6a-6e show --, therefor.

In Column 8, Lines 9-11, delete "FIG. 9a illustrates a multi-layered interconnect device termed a slug and the relationship to one die, configured in accordance with one embodiment of the invention.".

Signed and Sealed this
Sixteenth Day of September, 2014

Michelle K. Lee
*Deputy Director of the United States Patent and Trademark Office*

CERTIFICATE OF CORRECTION (continued)

In Column 8, Line 52, delete "DESCRIPTION" and insert -- DETAILED DESCRIPTION --, therefor.

In Column 10, Lines 63-64, delete "70, 71, . . . 7n" and insert -- 71, . . . 7n --, therefor.

In Column 11, Line 34, delete "multi-layered die 250, 260." and insert -- multi-layered die 255, 260. --, therefor.

In Column 11, Line 59, delete "invention to," and insert -- invention to --, therefor.

In Column 12, Line 33, delete "dog leg" and insert -- dogleg --, therefor.

In Column 12, Lines 38-39, delete "top and sides of dies 350, 355, and 365" and insert -- top and sides of dies 350, 355, 360 and 365 --, therefor.

In Column 15, Lines 30-31, delete "DLn and CLn+1." and insert -- $DL_N$ and $CL_{N+1}$. --, therefor.

In Column 15, Line 31, delete "DLn+1" and insert -- $DL_{N+1}$ --, therefor.

In Column 15, Line 33, delete "DLn+1 and CLn+2." and insert -- $DL_{N+1}$ and $CL_{N+2}$. --, therefor.

In Column 18, Line 2, delete "photonic detectors 882" and insert -- photonic detectors --, therefor.

In Column 18, Line 26, delete "beamwidth," and insert -- beamwidth --, therefor.

In Column 19, Line 52, delete "other," and insert -- other --, therefor.

In Column 21, Line 50, delete "contact points 1010." and insert -- contact pads 1010. --, therefor.

In Column 22, Line 10, delete "conducting," and insert -- conducting --, therefor.

In Column 23, Line 18, delete "there is not" and insert -- there is no --, therefor.

In Column 25, Line 18, delete "Mach-Zender" and insert -- Mach-Zehnder --, therefor.

In Column 26, Lines 3-4, delete "Mach-Zender" and insert -- Mach-Zehnder --, therefor.

In Column 26, Line 5, delete "Mach-Zender" and insert -- Mach-Zehnder --, therefor.

In Column 27, Line 23, delete "and or" and insert -- and/or --, therefor.

In Column 30, Line 46, delete "analog," and insert -- analog --, therefor.

In Column 30, Line 64, delete "processing," and insert -- processing --, therefor.